(12) United States Patent
Konstantatos et al.

(10) Patent No.: US 10,937,930 B2
(45) Date of Patent: Mar. 2, 2021

(54) LIGHT EMITTING DEVICE, AN OPTICAL SPECTROMETER, AND A DOWN-CONVERTING FILM FOR A LIGHT EMITTING DEVICE

(71) Applicants: FUNDACIÓ INSTITUT DE CIÈNCIES FOTÒNIQUES, Castelldefels (ES); INSTITUCIÓ CATALANA DE RECERCA I ESTUDIS AVANÇATS, Barcelona (ES)

(72) Inventors: Gerasimos Konstantatos, Castelldefels (ES); Santanu Pradhan, Castelldefels (ES)

(73) Assignees: FUNDACIÓ INSTITUT DE CIÈNCIES FOTÒNIQUES, Castelldefels (ES); INSTITUCIÓ CATALANA DE RECERCA I ESTUDIS AVANCATS, Barcelona (ES)

( * ) Notice: Subject to any disclaimer, the term of this patent is extended or adjusted under 35 U.S.C. 154(b) by 0 days.

(21) Appl. No.: 16/555,536

(22) Filed: Aug. 29, 2019

(65) Prior Publication Data

US 2020/0075812 A1 Mar. 5, 2020

(30) Foreign Application Priority Data

Aug. 29, 2018 (EP) ..................................... 18382629
Oct. 30, 2018 (EP) ..................................... 18203506

(51) Int. Cl.
*H01L 33/00* (2010.01)
*H01L 33/40* (2010.01)
(Continued)

(52) U.S. Cl.
CPC ............ *H01L 33/40* (2013.01); *H01L 33/002* (2013.01); *H01L 33/04* (2013.01); *H01L 33/14* (2013.01); *G01J 3/02* (2013.01)

(58) Field of Classification Search
CPC ......... H01L 33/40; H01L 33/62; H01L 33/14; H01L 33/04; H01L 33/002; H01L 33/50;
(Continued)

(56) References Cited

U.S. PATENT DOCUMENTS 9,073,752 B2 * 7/2015 Kang .................... H01L 51/502
10,700,236 B2 * 6/2020 Steckel ................ C09K 11/892
(Continued)

OTHER PUBLICATIONS

Long et al. ("Donor-acceptor interaction determines the mechanism of photoidnuced electron injection from graphene quantum dots into TiO2: -stacking supersedes covalent bonding," J. of American Chemical Society, 139, pp. 2619-2629, 2017) (Year: 2017).*
(Continued)

*Primary Examiner* — Yasser A Abdelaziez
(74) *Attorney, Agent, or Firm* — Jenkins, Wilson, Taylor & Hunt, P.A.

(57) ABSTRACT

Provided is a light emitting device that includes a substrate; a first electrode formed by a first electrically conductive layer arranged over the substrate; an active light emitting layer arranged over said first electrically conductive layer, and that includes a host matrix and light emitting quantum dots embedded there within; and a second electrode formed by a second electrically conductive layer arranged over the active light emitting layer. The host matrix has charge carrier supplier quantum dots blended with the light emitting quantum dots, forming a binary blend where the charge carrier supplier quantum dots are made and arranged to supply charge carriers to the light emitting quantum dots, and wherein the light emitting quantum dots are made and arranged to accept the supplied charge carriers. Also provided is a spectrometer having the LED and a down-converting film for a LED.

24 Claims, 22 Drawing Sheets

(51) Int. Cl.
*H01L 33/14* (2010.01)
*H01L 33/04* (2010.01)
*G01J 3/02* (2006.01)

(58) Field of Classification Search
CPC ....... H01L 51/502; H01L 51/50; H01L 33/44;
H01L 33/06; G01J 3/02; G01J 2003/102;
G01J 2003/106; G01J 2003/2806; G01J
3/12; G01J 3/2803; G01J 3/10; Y02E
10/548; C09K 11/661; C09K 11/02;
H05B 33/14
See application file for complete search history.

(56) References Cited

U.S. PATENT DOCUMENTS

| | | | |
|---|---|---|---|
| 2009/0109435 A1 | 4/2009 | Kahen et al. | |
| 2010/0270511 A1* | 10/2010 | LoCascio ............... | B82Y 30/00 252/501.1 |
| 2011/0284819 A1 | 11/2011 | Kang et al. | |
| 2018/0019371 A1 | 1/2018 | Steckel et al. | |
| 2018/0175241 A1* | 6/2018 | Jain ........................ | B82Y 10/00 |
| 2019/0296257 A1* | 9/2019 | Palles-Dimmock ........................ | H01L 51/5056 |

OTHER PUBLICATIONS

Sun et al. ("Bright Infrared Quantum-Dot Light-Emitting Diodes through Inter-Dot Spacing Control," Nature Nanotechnology, vol. 7, pp. 369-373, Jun. 2012) (Year: 2012).*
Long et al. ("Donor-Acceptor Interaction Determines the Mechanism of Photoinduced Electron Injection from Graphene Quantum Dots into TiO2: Tr-Stacking Supersedes Covalent Bonding," JACS, 139, pp. 2619-2629, 2017) (Year: 2017).*
Bi, Y. et al., Colloidal quantum dot tandem solar cells using chemical vapor deposited graphene as an atomically thin intermediate recombination layer. ACS Energy Lett. 3, 1753-1759 (2018).
Bi, Y. et al. Infrared solution-processed quantum dot solar cells reaching external quantum efficiency of 80% at 1.35 μm and JSC in excess of 34 mA cm-2. Adv. Mater. 30, 1704928 (2018).
Borek, C. et al. Highly efficient, near-infrared electro phosporescence from a Pt-metalloporphyrin complex, Angew. Chem. 46, 1109-1112 (2007).
Bourdakos, K. N., Dissanayake, D. M. N. M., Lutz, T., Silva, S. R. P. & Curry, R. J. Highly efficient near-infrared hybrid organic-inorganic nanocrystal electroluminescence device. Appl. Phys. Lett. 92, 153311 (2008).
Bozyigit, D., Volk, S., Yarema, O. & Wood, V. Quantification of deep traps in nanocrystal solids, their electronic properties, and their influence on device behavior, Nano Lett. 13, 5284-5288 (2013).
Cao, Y., Stavrinadis, A., Lasanta, T., So, D. & Konstantatos, G. The role of surface passivation for efficient and photostable PbS quantum dot solar cells. Nat. Energy 1, 16035 (2016).
Carey, G. H., Levina, L. Comin, R., Voznyy, O. & Sargent, E. H. Record charge carrier diffusion length in colloidal quantum dot solids via mutual dot-to-dot surface passivation. Adv. Mater. 27, 3325-3330 (2015).
Chou, K. F. & Dennis, A. M. Förster resonance energy transfer between quantum dot donors and quantum dot acceptors. Sensors 15, 13288-13325 (2015).
Choudhury, K., Song, D.W. & So, F. Efficient solution-processed hybrid polymer-nanocrystal near infrared light-emitting devices. Org. Electron. 11, 23-28 (2010).
Chuang, C.-H.M. et al. Open-circuit voltage deficit, radiative sub-bandgap states, and prospects in quantum dot solar cells. Nano Lett. 15, 3286-3294 (2015).
Chuang, C. -H. M., Brown, P. R., Bulović, V. & Bawendi, M. G. Improved performance and stability in quantum dot solar cells through band alignment engineering. Nat. Mater. 13, 796-801 (2014).

Colvin, V. L., Schlamp, M. C. & Alivisatos, A. P. Light-emitting diodes made from cadmium selenide nanocrystals and a semiconducting polymer. Nature 370,354-357 (1994).
Dai, X. et al. Solution-processed, high-performance light-emitting diodes based on quantum dots. Nature 515, 96-99 (2014).
de Mello, J. C., Wittmann, H. F. & Friend, R. H. An improved experimental determination of externam photoluminescence quantum efficiency. Adv. Mater. 9, 2300-232 (1997).
European Search Report and Opinion for EP 3 618 130 dated Feb. 11, 2019.
Gong, X. et al. Highly efficient quantum dot near-infrared light emitting diodes. Nat. Photonics 10, 253-257 (2016).
Goossens, S. et al. Broadband image sensor array based on graphene-CMOS integration. Nat. Photonics 11, 366-371 (2017).
Greenham, N.C., Friend, R. H. & Bradley, D. D. C. Angular dependence of the emission from a conjugated polymer light-emitting diode: Implications for efficiency calculations. Adv. Mater. 6, 491-494 (1994).
Hines, M. A. & Scholes, G. D. Colloidal PbS nanocrystals with size-tunable near-infrared emission: observation of post-synthesis self-narrowing of the particle size distribution. Adv. Mater. 15, 1844-1849 (2003).
Ji, W. et al. The work mechanism and sub-bandgap-voltage electroluminescence in inverted quantum dot light-emitting diodes. Sci. Reports 4, 6974 (2014).
Jin, Z., Wang, A., Zhou, Q., Wang, Y. & Wang, J. Detecting trap states in plana PbS colloidal quantum dot solar cells. Sci. Reports, 6, 37106 (2016).
Kim, J. et al. Battery-free, stretchable optoelectronic systems for wireless optical characterization of the skin. Sci. Adv. 2, e1600418 (2016).
Konstantatos, G. et al. Ultrasensitive solution-cast quantum dot photodetectors. Nature 442, 180-183 (2006).
Konstantatos, G., Huang, C., Levina, L., Lu, Z. & Sargent, E. H. Efficient infrared electroluminescent devices using solution-processed colloidal quantum dots. Adv. Func. Mater. 15, 1865-1869 (2005).
Lan, X. et al. Passivation using molecular halides increases quantum dot solar cell performance. Adv. Mater. 28, 299-304 (2016).
Lee, J. W., Kim, D. Y., Baek, S., Yu, H. & So, F. Inorganic UV-Visible-SWIR broadband photodetector based on monodisperse PbS nanocrystals. Small 12, 1328-1333 (2016).
Li, J. et al. Single-layer halide perovskite light-emitting diodes with sub-band gap turn-on voltage and high brightness. J. Phys. Chem. Lett. 7, 4059-4066 (2016).
Liu, M. et al. Hybrid organic-inorganic inks flatten the energy landscape in colloidal quantum dot solids. Nat. Mater. 16, 258-263 (2017).
Lopez, A., Arazuri, S., García, Garcia, I., Mangado, J. & Jaren, C. A review of the application of near-infrared spectroscopy for the analysis of potatoes. J. Agric. Food Chem. 61, 5413-5424 (2013).
Mashford, B. S. et al. High-efficiency quantum-dot light-emitting devices with enhanced charge injection. Nat. Photonics 7, 407-412 (2013).
Medintz, I. L,, Uyeda, H. T., Goldman, E. R. & Mattoussi, H. Quantum dot bio conjugates for imaging, labelling and sensing. Nat. Mater. 4, 435-446 (2005).
Murphy, C.J. Optical sensing with quantum dots. Anal. Chem. 74, 520 A-526A (2002).
Nagpal, P. & Klimov, V. I. Role of mid-gap states in charge transport and photoconductivity in semiconductor nanocrystal films. Nat. Commun. 2, 486 (2011).
Pal, B. N. et al. 'Giant' CdSe/CdS core/shell nanocrystal quantum dots as efficient electroluminescent materials: strong influence of shell thickness on light-emitting diode performance. Nano Lett. 12, 331-336 (2012).
Park S. I. et al. Soft, stretchable, fully implantable miniaturized optoelectronic systems for wireless optogenetics. nat. Biotechnol. 33, 1280-1286 (2015).
Pradhan, S. et al. Trap-state suppression and improved charge transport in pbs quantum dot solar cells with synergistic mixed-ligand treatments. Small 13, 1700598 (2017).

(56) References Cited

OTHER PUBLICATIONS

Pradhan, S., Stavrinadis, A., Gupta, S., Christodoulou, S. & Konstantatos, G. Breaking the open-circuit voltage deficit floor in pbs quantum dot solar cells through synergistic ligand and architecture engineering. ACS Energy Lett. 2, 1444-1449 (2017).
Qian, L. et al. Electroluminescence from light-emitting polymer/ZnO nanoparticle heterojunctions at sub-bandgap voltages. Nano Today 5, 384-389 (2010).
Rath, A. K. et al. Remote trap passivation in colloidal quantum dot bulk nano-heterojunctions and its effect in solution-processed solar cells. Adv. Mater. 26, 4741-4747 (2014).
Rau, U. Reciprocity relation between photovoltaic quantum efficiency and electroluminescent emission of solar cells. Phys. Rev. B 76, 085303 (2007).
Sargent, E. H. Colloidal quantum dot solar cells. Nat. Photonics 6, 133-135 (2012).
Shirasaki, Y., Supran, G. J., Bawendi, M. G. & Bulović, V. Emergence of colloidal quantum-dot light-emitting technologies. Nat. Photonics 7, 13-23 (2013).
Sun, L. et al. Bright infrared quantum-dot light-emitting diodes through inter-dot spacing control. Nat. Nanotechnol. 7, 369-373 (2012).
Supran, G. J. et al. High-performance shortwave-infrared light-emitting devices using core-shell (PbS-CdS) colloidal quantum dots. Adv. Mater. 27, 1437-1442 (2015).
Tessler, N., Medvedev, V., Kazes, M., Kan, S. & Banin, U. Efficient near-infrared polymer nanocrystal light-emitting diodes. Science 295, 1506-1508 (2002).
Tress, W. Perovskite solar cells on the way to their radiative efficiency limit—insights into a success story of high open-circuit voltage and low recombination. Adv. Energy Mater. 7, 1602358 (2017).
Ushakova, E. V. et al. Anomalous size-dependent decay of low-energy luminescence from PbS quantum dots in colloidal solution. ACS Nano 6, 8913-8921 (2012).
Voura, E. B., Jaiswal, J. K., Mattoussi, H. & Simon, S. M. Tracking early metastatic progression with quantum dots and emission scanning microscopy. Nat. Med. 10, 993-998 (2004).
Walter, T., Herberholz, R., Müller, G. & Schock, H. W. Determination of defect distributions from admittance measurments and application to Cu(In,Ga)Se2 based heterojunctions. J. Appl. Phys. 80, 4411 (1996).
Yang, X. et al. Iodide capped PbS/CdS core-shell quantum dots for efcient long wavelengty near-infrared lightemitting diodes. Sci. Reports 7, 14741 (2017).
Yang, Z. et al. All-quantum-dot infrared light-emitting diodes. ACS Nano 9, 12327-12333 (2015).
Yao, J. et al. Quantifying losses in open-circuit voltage in solution-processable solar cells. Phys. Rev. Applied 4, 014020 (2015).
Zhitomirsky, D. et al. Engineering colloidal quantum dot solids within and beyond the mobility-invariant regime. Nat. Commun. 5, 3803 (2014).
Zhitomirsky, D., Voznyy, O., Hoogland, S. & Sargent, E. H. Measuring charge carrier diffusion in coupled colloidal quantum dot solids. ACS Nano 7, 5282-5290 (2013).
Zhou, Y. et al. Near Infrared, Highly efficient luminescent solar concentrators. Adv. Energy Mater. 6, 150913 (2016).

* cited by examiner

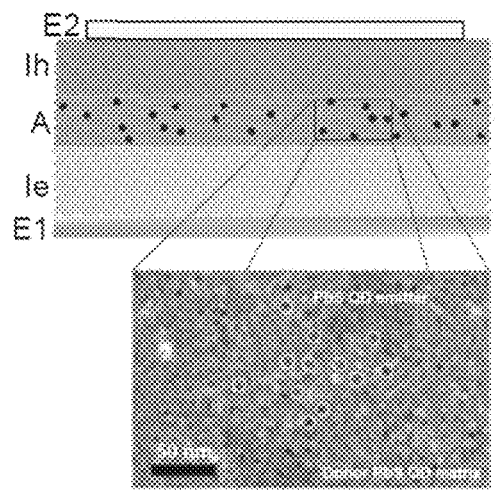 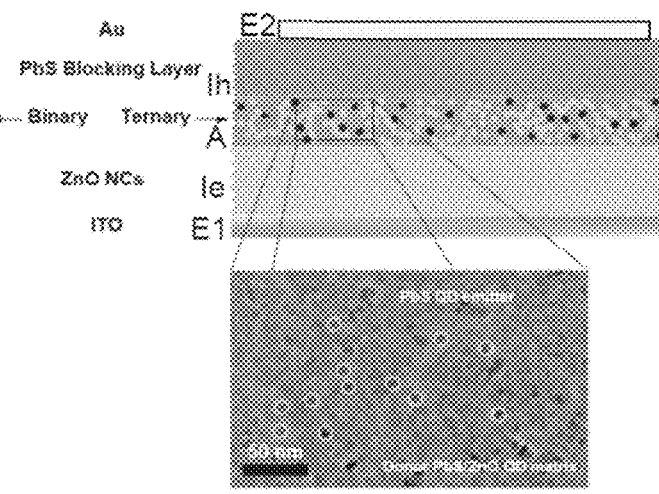
FIG. 1A  FIG. 1B
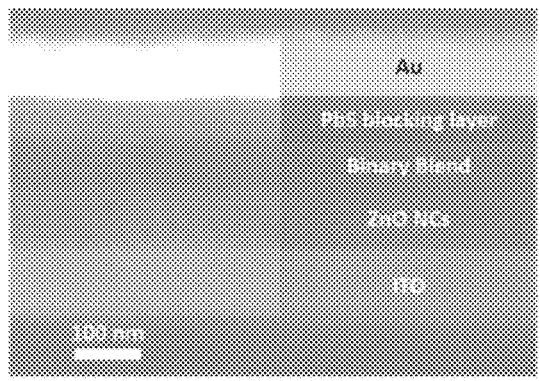 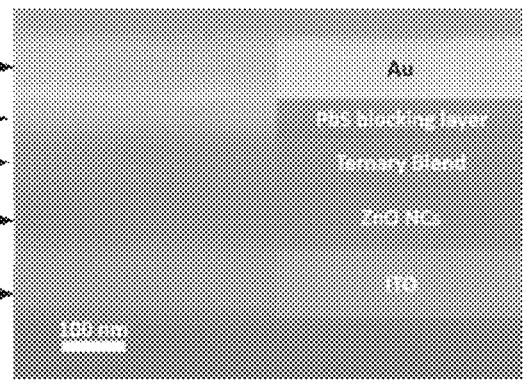
FIG. 1C  FIG. 1D
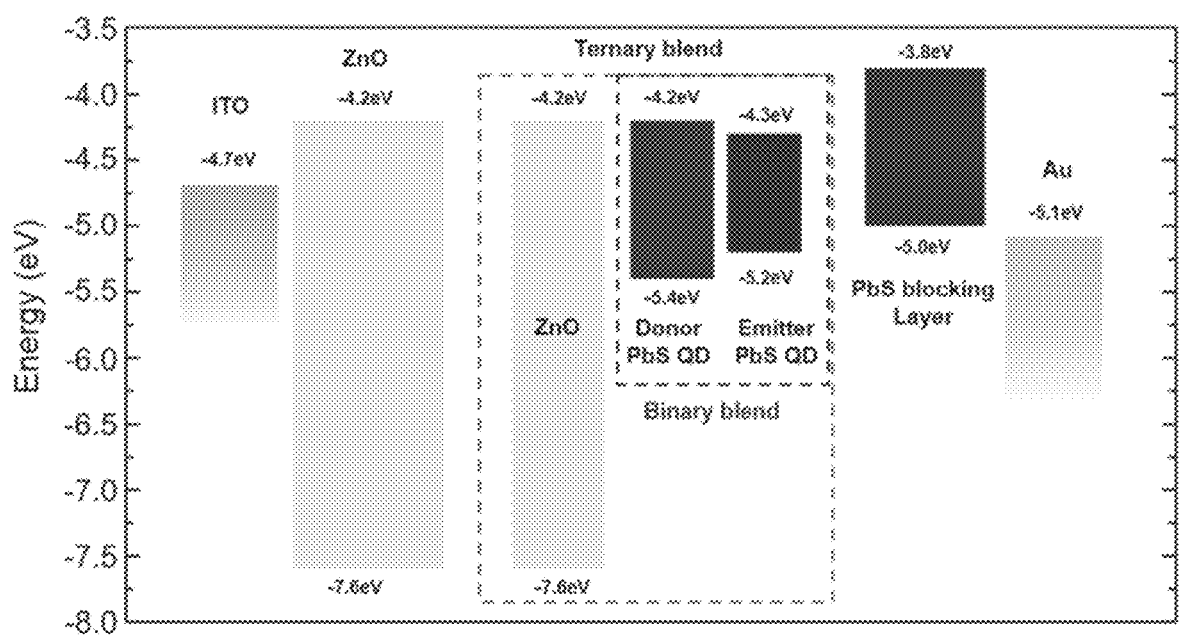
FIG. 1E

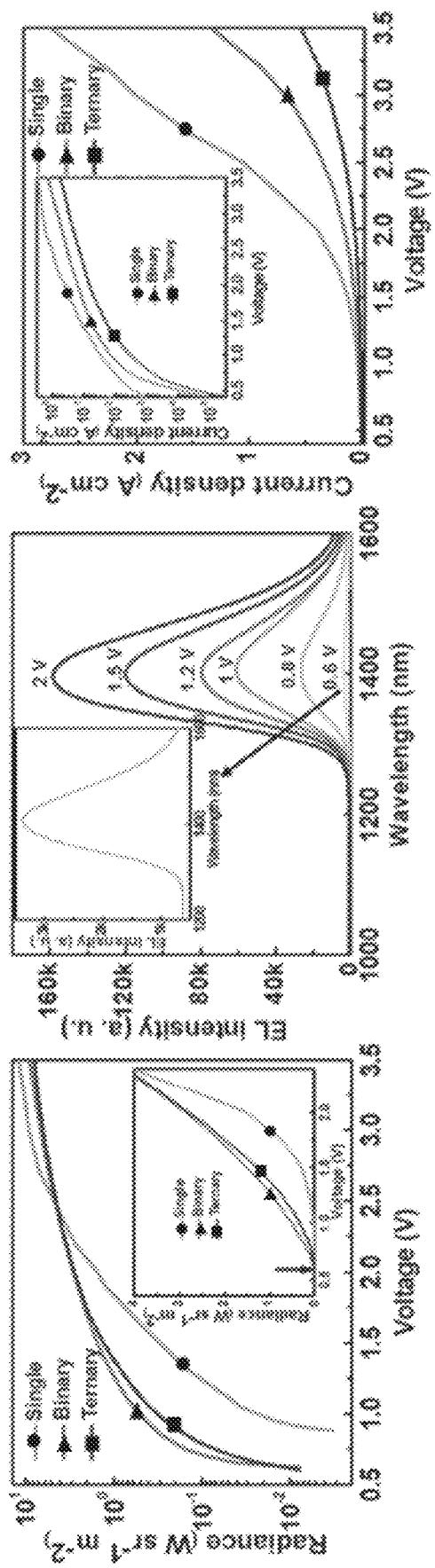
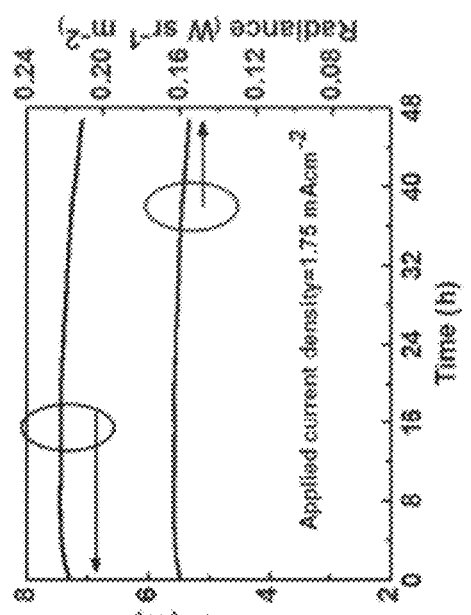
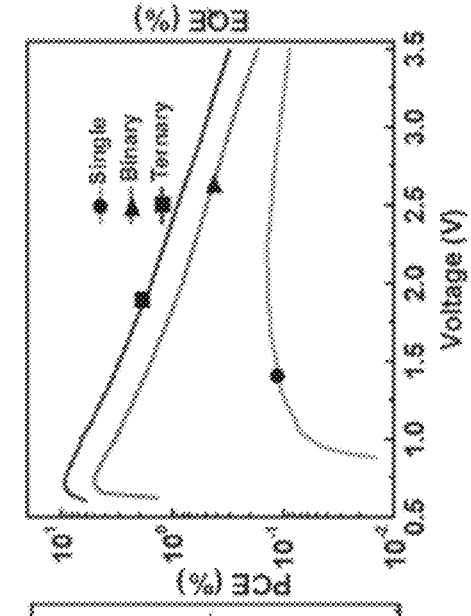
FIG. 2A  FIG. 2B  FIG. 2C
FIG. 2D  FIG. 2E  FIG. 2F

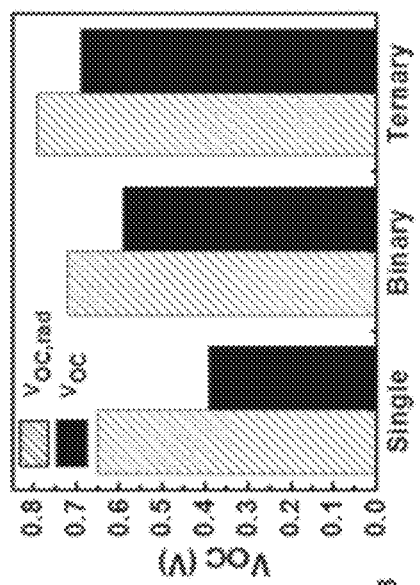
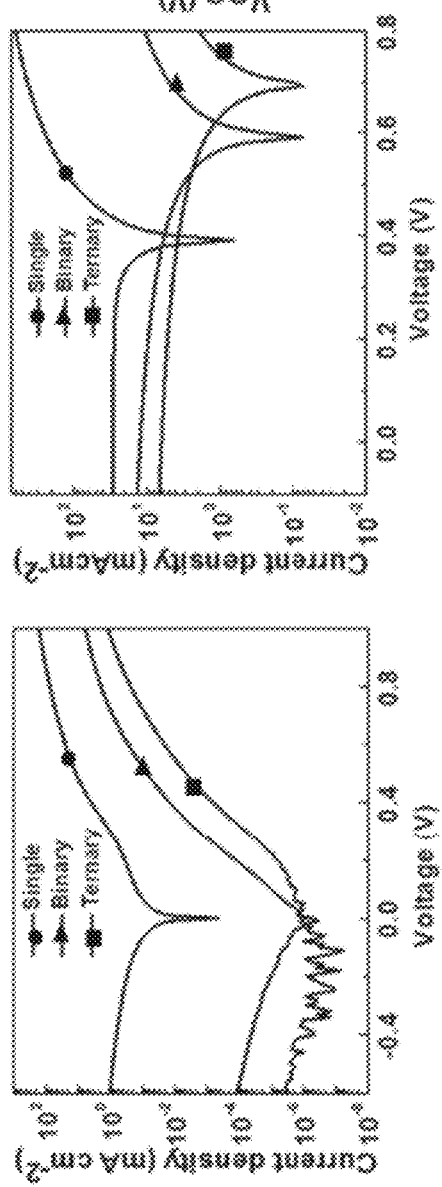
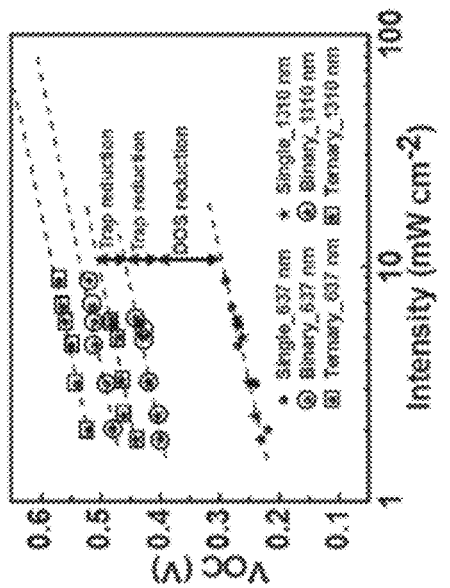
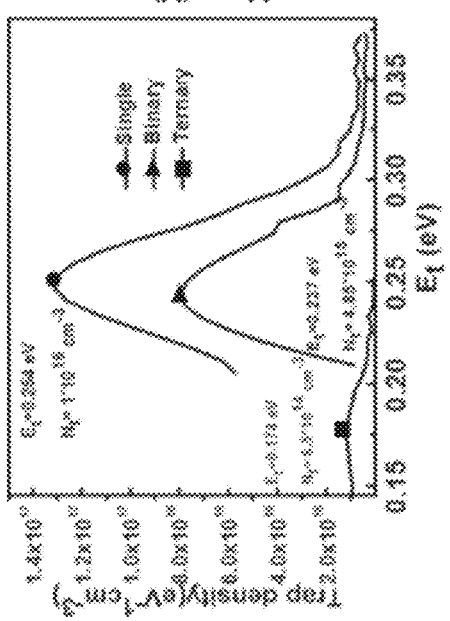
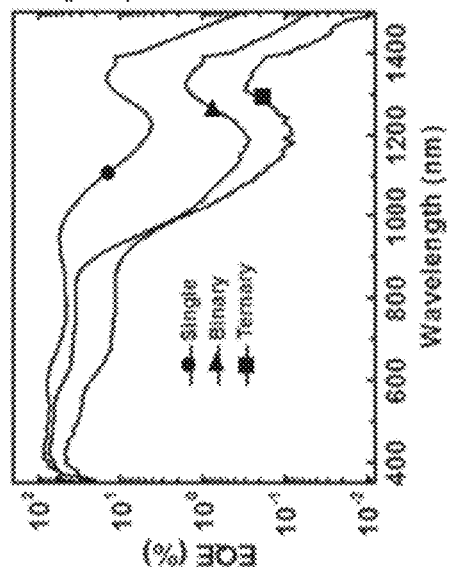
FIG. 4A  FIG. 4B  FIG. 4C
FIG. 4D  FIG. 4E  FIG. 4F

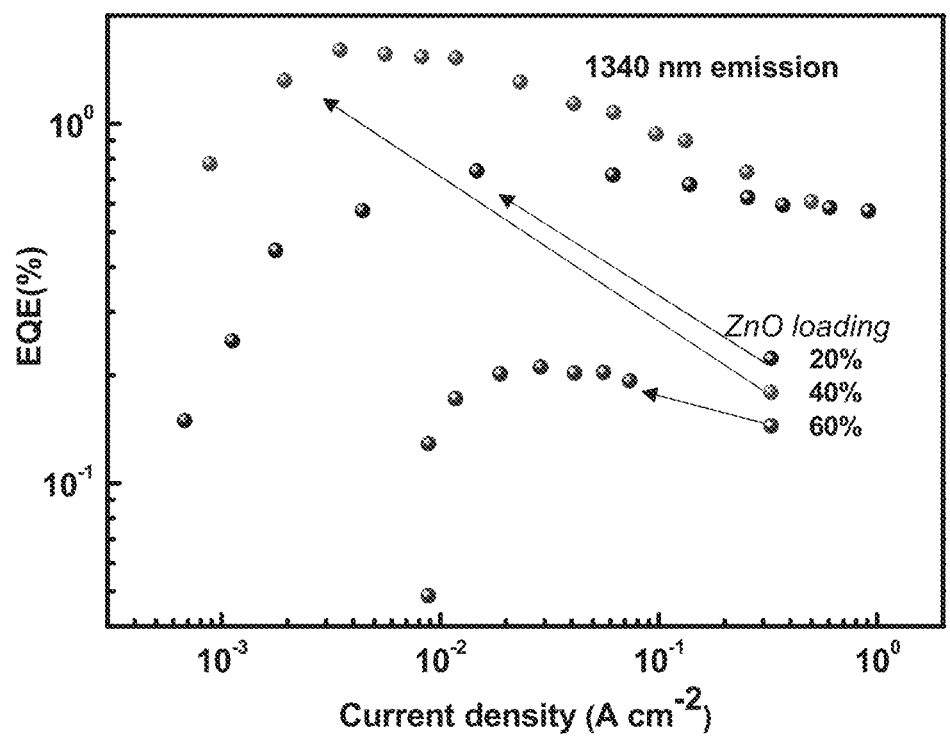
Fig. 18
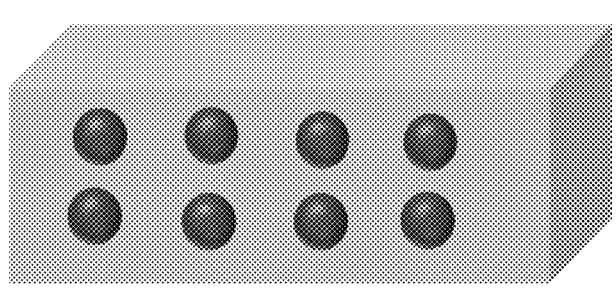 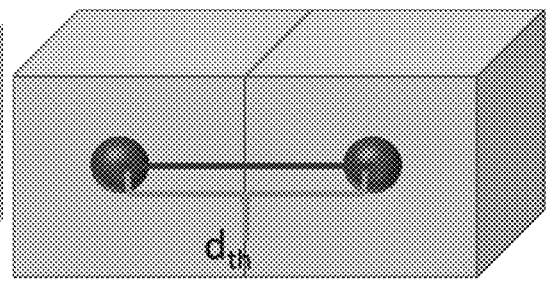
Fig. 19A          Fig. 19B

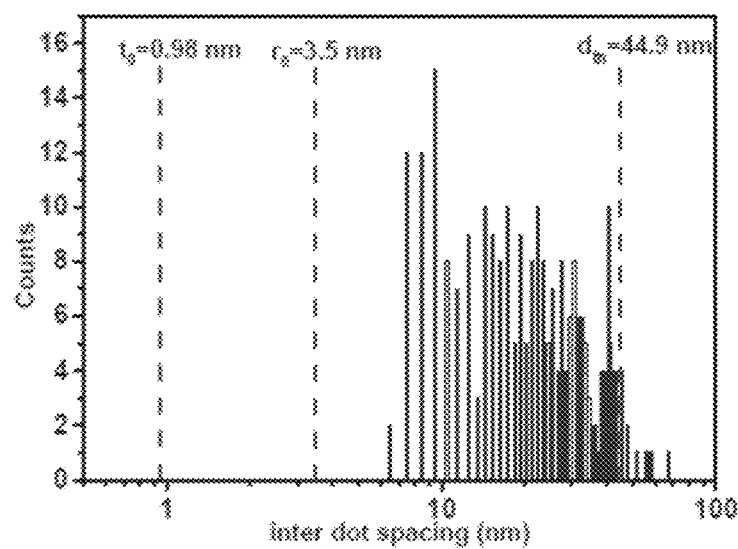
FIG. 20
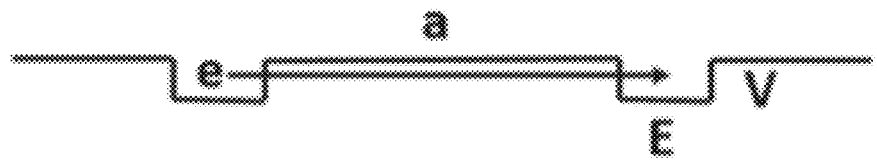
FIG. 21A
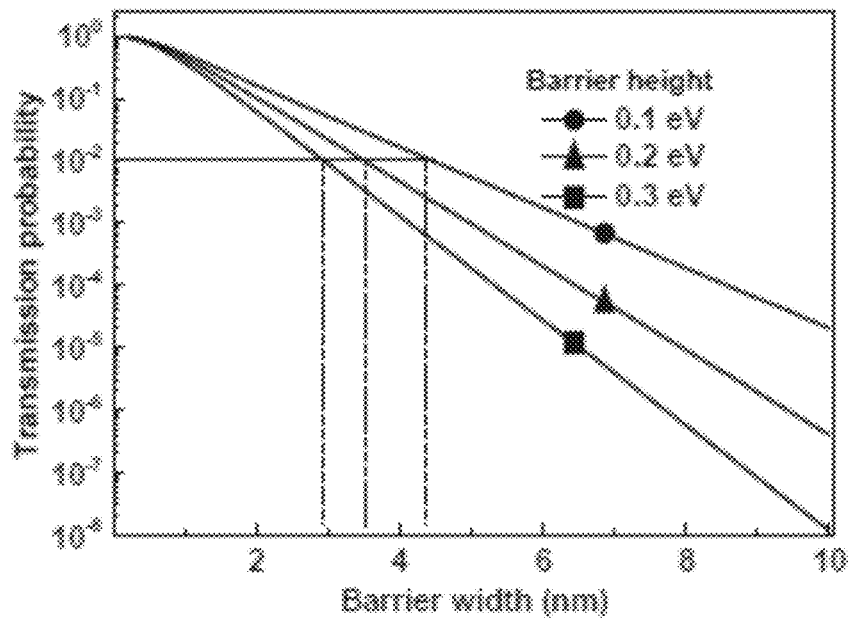
FIG. 21B

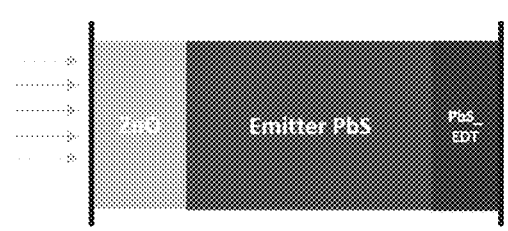
Fig. 25A
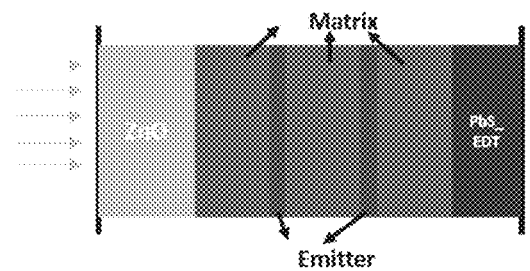
Fig. 25B
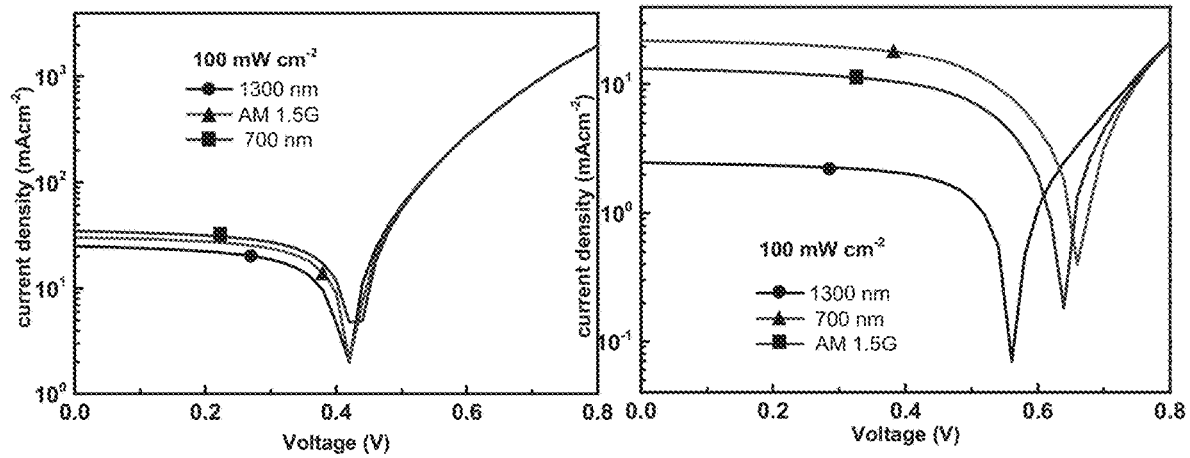
Fig. 26A  Fig. 26B

LIGHT EMITTING DEVICE, AN OPTICAL SPECTROMETER, AND A DOWN-CONVERTING FILM FOR A LIGHT EMITTING DEVICE

CROSS-REFERENCE TO RELATED APPLICATIONS

This application is based on and claims the benefit of priority from European Patent Application Nos. 18382629, filed Aug. 29, 2018, and 18203506, filed Oct. 30, 2018, the contents of both of which are expressly incorporated by reference herein in their entireties.

FIELD OF THE INVENTION

The present invention generally relates to a light emitting device (LED), and more particularly to a highly efficient and low cost light emitting device, that is suitable for emitting visible light and also infrared light including near and short-wave infrared light.

Further aspects of the invention refer to a spectrometer comprising the LED of the invention, and to a down-converting film for a LED.

BACKGROUND OF THE INVENTION

Colloidal quantum dots (CQDs) have been established as one of the most promising optoelectronic material platform serving applications related to photodetection [1], photovoltaics [2,3] and light emission [4-6], in view of their solution-processability, broadband bandgap tunability and favourable optoelectronic properties [7]. CQD light emitting diodes (LEDs) with compelling performance, based on Cd-chalcogenide systems, have been reported in the visible part of spectrum [8,9], and have successfully reached commercialization. Yet infrared emitting CQDs, mainly based on Pb-chalcogenides, currently underperform their visible emitting counterparts, largely limited by their low photoluminescence quantum efficiency (PLQE) [10].

Near and short-wave infrared (NIR, SWIR) light emitting diodes serve a rather broad range of applications, including night vision [11], surveillance [12], remote sensing [13], biological imaging [14], and spectroscopy [15]. Recent progress in on-chip and wearable infrared spectroscopy for quality inspection, health and process monitoring also requires the development of highly efficient, CMOS-compatible and low cost NIR and SWIR LEDs [16-18]. In contrast to other highly performant solution processed materials such as polymers and dyes, whose bandgaps are mainly limited in the visible, CQDs offer a unique opportunity as they readily provide access to the infrared part of spectrum [7]. In view of this, several efforts have been made to develop highly efficient CQD infrared-emitting LEDs [re 10,19-23]. One fundamental determinant factor of a diode's external quantum efficiency (EQE), defined as the ratio of the number of emitted photons over the number of injected electric carriers is the PLQE. Prior reports on infrared CQD LEDs have considered the use of core-shell CQD structures [10], inspired by the case of visible emitting CQDs, reaching EQE in excess of 4%. Alternatively, the use of appropriate host matrices has been considered as a means to suppress PLQE quenching in close-packed CQDs due to energy transfer. Initial reports have employed polymer host matrices [24-27], yet with limited EQEs mainly due to the polymers' poor electron transport properties. Recently, an alternative matrix has been reported based on perovskite materials epitaxially connected to the CQD emitting species serving both as a chemical passivant of the QD surface and as an efficient carrier transport matrix, leading to EQE of 5.2% and power conversion efficiency (PCE) of 4.9% [21]. PCE in LEDs is defined as the ratio of optical output power over the electrical input power and it is of paramount importance when considering the power consumption of the device.

EP2212398B1 discloses a light emitting device comprising:
  a substrate;
  a first electrode formed by a first electrically conductive layer arranged over said substrate;
  an active light emitting layer arranged over said first electrically conductive layer, and that comprises a host matrix and light emitting quantum dots embedded therewithin; and
  a second electrode formed by a second electrically conductive layer arranged over said active light emitting layer.

The host matrix of the device disclosed in EP2212398B1 is a semiconductor matrix made of nanoparticles that are not quantum dots, and offers a quantum efficiency that is clearly improvable.

It is, therefore, necessary to provide an alternative to the state of the art which covers the gaps found therein, by providing a light emitting device that offers a much higher efficiency than the devices known in the prior art, in terms of quantum efficiency (external and internal) and power conversion efficiency, and a high radiance.

SUMMARY OF THE INVENTION

To that end, the present invention relates, in an aspect, to a light emitting device (LED), comprising an optoelectronic device comprising:
  a substrate;
  a first electrode formed by a first electrically conductive layer arranged over said substrate;
  an active light emitting layer arranged over said first electrically conductive layer, and that comprises a host matrix and light emitting quantum dots embedded therewithin; and
  a second electrode formed by a second electrically conductive layer arranged over said active light emitting layer.

In contrast to the light emitting devices known in the prior art, in the light emitting device of the present invention the host matrix comprises charge carrier supplier quantum dots blended with said light emitting quantum dots, forming a binary blend where the charge carrier supplier quantum dots are made and arranged to supply charge carriers to the light emitting quantum dots, and wherein the light emitting quantum dots are made and arranged to accept the supplied charge carriers.

Although the light emitting device of the present invention is made to emit light of any wavelength, for some preferred embodiments the device is made to emit infrared, near infrared and/or short-wave infrared light.

For an embodiment of the light emitting device of the present invention, the host matrix comprises a ternary blend formed by the above mentioned binary blend and further quantum dots made and arranged to passivate electronically possible electron traps of the light emitting quantum dots and to balance charge carrier injection.

The above mentioned charge carrier supplier quantum dots are, for an embodiment, smaller than the light emitting quantum dots, have a larger bandgap and form a type-I heterojunction therewith.

For an implementation of said embodiment, said type-I heterojunction has band offsets in the conduction and valence band ranging from 0.05 eV up to 1 eV.

With respect to the above mentioned further quantum dots, for an embodiment, they have a bandgap that is larger than that of the charge carrier supplier quantum dots, and a band alignment with respect to the bands of the charge carrier supplier quantum dots and light emitting quantum dots that favors injection of electrons or holes in the light emitting quantum dots, but not both, forming a type-I heterojunction therewith.

For an implementation of said embodiment, a type-I or quasi type-I heterojunction is formed between the further quantum dots and the light emitting quantum dots, with a band offset for the conduction band ranging from 0 eV to 0.5 eV and a large band offset in the valence band in excess of 1 eV. A quasi type-I heterojunction means there is confinement (band offset) either in the conduction band or the valence band but not both, the other is matched (otherwise it would become a type-II heterojunction).

A preferred embodiment combines the above disclosed implementations of embodiments, i.e. that for which a type-I heterojunction is formed between the charge carrier supplier quantum dots and the light emitting quantum dots, and that for which a type-I or quasi type-I heterojunction is formed between the further quantum dots and the light emitting quantum dots.

For some embodiments, the concentration of the light emitting quantum dots in the binary or ternary blend ranges from 1% up to 20% by volume, and the concentration of the charge carrier supplier quantum dots in the binary or ternary blend ranges from 80% up to 99% in volume, preferably from 50% up to 99% by volume.

For a preferred embodiment, the concentration of the light emitting quantum dots in the binary or ternary blend is chosen to reduce the density of states to an extent that decreases the turn-on voltage of the light emitting device below the bandgap of emission.

Said chosen concentration of the light emitting quantum dots in the binary or ternary blend is between 1% and 10%, preferably about or below 7.5%, more preferably below 3% and even more preferably of about 1%.

Regarding the concentration of the further quantum dots in the ternary blend, according to some embodiments, it ranges between 0% and 60% by volume, preferably from 20% up to 50% and more preferably from 30% up to 50%.

According to a preferred embodiment, the host matrix forms an electrically conductive percolating path, while the light emitting quantum dots are dispersed within the host matrix so distanced and isolated from each other that they do not form any electrically conductive path.

Advantageously the light emitting quantum dots are homogeneously dispersed within the host matrix and distanced above 3 nm from each other.

For an embodiment, the charge carrier supplier quantum dots possess carrier diffusion lengths larger than 10 nm for both types of charge carriers, electrons and holes, preferably in a range from 10 nm up to 500 nm.

For preferred embodiments, the light emitting device of the present invention further comprises:
  an electron injecting and hole blocking layer arranged between said active light emitting layer and one of said first and second electrodes; and a hole injecting and electron blocking layer arranged between said active light emitting layer and the other of said first and second electrodes.

For an embodiment, the light emitting device of the present invention is a bottom emitting device, where the substrate and the one of the above mentioned electron injecting and hole blocking layer and hole injecting and electron blocking layer which is arranged between the active light emitting layer and the first electrode are transparent to a wavelength range of illumination of the light emitting device, while a reflective layer (such as the electron injecting and hole blocking layer or the hole injecting and electron blocking layer which is arranged between the active light emitting layer and the second electrode) is placed between the active light emitting layer and the second electrode. Preferably, the first electrode is also transparent to said wavelength range.

For an alternative embodiment, the light emitting device of the present invention is a top emitting device, where the one of the above mentioned electron injecting and hole blocking layer and hole injecting and electron blocking layer which is arranged between the active light emitting layer and the second electrode are transparent to a wavelength range of illumination of the light emitting device, while a reflective layer (such as the electron injecting and hole blocking layer or the hole injecting and electron blocking layer which is arranged between the active light emitting layer and the first electrode) is placed between the active light emitting layer and the first electrode. Preferably, the second electrode is also transparent to said wavelength range, while the substrate is not necessarily transparent.

For an embodiment, the electron injecting and hole blocking layer is arranged between the active light emitting layer and the first electrode, and the hole injecting and electron blocking layer is a semiconductor layer that forms a type-II heterojunction with all of the quantum dots of the active light emitting layer.

For an implementation of said embodiment, the hole injecting and electron blocking semiconductor layer comprises quantum dots.

Both the charge carrier supplier quantum dots and the light emitting quantum dots are PbS quantum dots, for an embodiment.

According to an embodiment, the further quantum dots are ZnO nanocrystals.

The quantum dots of the different layers of the LED of the present invention are generally colloidal quantum dots.

For an embodiment, the light emitting quantum dots are isolated by being separated from one another by a distance ranging from 5 nm up to 999 nm.

According to an embodiment, the bandgaps of the light emitting quantum dots are from 1.5 eV to 0.5 eV, or lower, although light emitting quantum dots bandgaps for a visible emission are also covered by the present invention, for other embodiments.

For further aspects of the invention, instead of a LED, a photodetector and a solar cell are proposed which differ structurally with the LED of the present invention basically in that the above referred as active light emitting layer is an active light absorbing layer much thicker than the active light emitting layer of the LED.

For the solar cell, the concentration of the light emitting quantum dots in the binary or ternary blend is chosen to reduce the density of states to an extent that increases the open circuit voltage ($V_{OC}$), said chosen concentration preferably being between 5% and 10%, and more preferably about 7.5%.

A further aspect of the present invention relates to an optical spectrometer that comprises the light emitting device of the present invention and at least one photodetector made to detect light with any of the wavelengths that the light emitted by the light emitting device has.

The spectrometer of the present invention is configured for emitting light, by means of the light emitting device, with different wavelengths onto an object, and the at least one photodetector is made to detect light with any of said different wavelengths once reflected or transmitted from the object.

For a preferred embodiment, the at least one photodetector is based on quantum dots, CMOS compatible, and monolithically integrated with the light emitting device into a common chip.

For an embodiment, the at least one photodetector of the spectrometer is a hybrid graphene-QDs photodetector or a QD photodiode.

For an embodiment, the optical spectrometer of the present invention comprises a pixelated LED array of LEDs as described above wherein each one of those employ emitting QDs of different size thereby offering spectral luminescence in different wavelengths that can be separated from each other from 20 nm up to 200 nm, to allow for spectroscopy function. In this configuration, the LEDs of the array are excited sequentially and the at least one photodetector of the spectrometer records the reflected/transmitted signal from the object under spectroscopic test for each excitation wavelength. In an improvement of this embodiment narrowband bandpass filters in front of the LEDs are used to enhance the spectral resolution of the LEDs. In this scenario the bandpass zone of the filter(s), in nm, is smaller than that of the FWHM (Full Width at Half Maximum) of the LED, allowing the resolution of the spectrometer to be determined by that of the bandpass filters and not by that of the LEDs.

In a different embodiment, the LED array is excited simultaneously providing a broadband response of light that comprises the superposition of the light emitting spectra of the LEDs and in the detection part there is an array of photodetectors each one of which is covered by an appropriate bandpass filter so that each photodetector of the array yields a signal from that received by the reflected or transmitted light from the object under test, within the spectral band of the bandpass filter covering the respective photodetector.

In both spectrometer embodiments, appropriate optics should be included comprising lens systems that focus the excitation light from the LEDs to the object under test, and collection optics also exist to collect the reflected/transmitted light from the object under test to the photodetectors.

A further aspect of the present invention relates to a down-converting film for a LED, where the down-converting film comprises the above described active light emitting layer and is configured and arranged to be placed atop said LED to absorb and down convert light emitted thereby, i.e. to emit light at longer wavelengths.

For an embodiment, the down-converting film is made to absorb visible light and provide broadband illumination in the visible and SWIR wavelength range.

All the embodiments describing above the composition and arrangement of the active light emitting layer are valid for describing corresponding embodiments of the down-converting film of the present invention.

In a still further aspect, the present invention also relates to a nanocomposite comprising at least the above described active light emitting layer.

For an embodiment, the nanocomposite also comprises the above mentioned electron injecting and hole blocking layer and the hole injecting and electron blocking layer, sandwiching the active light emitting layer.

All the embodiments describing above the composition and arrangement of the electron injecting and hole blocking layer, the active light emitting layer, and the hole injecting and electron blocking layer of the LED of the present invention, are valid for describing corresponding embodiments of the nanocomposite of the present invention.

BRIEF DESCRIPTION OF THE FIGURES

In the following some preferred embodiments of the invention will be described with reference to the enclosed figures. They are provided only for illustration purposes without however limiting the scope of the invention.

FIGS. 1A-1E: Structure and composition of the light emitting device of the present invention for an embodiment for which the active light emitting layer is formed by a binary blend of quantum dots (FIG. 1A) and an embodiment for which it is formed by a ternary blend of quantum dots (FIG. 1B). TEM images of ligand treated binary and ternary blends respectively that comprise the active light emitting layer of the corresponding LEDs are shown as well. Circular white markers show the emitter QDs in donor matrix. FIGS. 1C and 1D. FIB SEM cross-sectional images of binary (FIG. 1C) and ternary FIG. 1D) blend based LED devices. FIG. 1E. Energy level diagram of the materials that constitute the LED devices. The energy values are taken from UPS measurements.

FIGS. 2A-2F: Performance of the LED device of the present invention for two embodiments identified as "binary" and "ternary" (blends of QDs) and of a prior art LED device identified as "single" (blend of QDs). FIG. 2A. Radiance of the devices with applied voltage bias. Inset shows the radiance in linear scale to indicate the turn-on voltage. The depicted arrow shows the low turn-on voltage of 0.6 V in case of binary and ternary blends devices. FIG. 2B. EL spectra of ternary blend device with different applied bias voltage. Inset shows the zoomed EL spectra with 0.6 V applied bias. Strong sub-bandgap emission is observed in the devices. FIG. 2C. Injection current density is plotted as a function of applied bias. Inset shows the logarithmic plot to indicate the gradual suppression of leakage current from single to binary and further to ternary blend devices. FIG. 2D. EQE of the devices are plotted against injected current. FIG. 2E. PCE of the devices with applied voltage bias. FIG. 2F. Stability test of the champion device. The radiance and EQE of the device are observed with a constant applied current density of 1.75 mA $cm^{-2}$ over a period of 48 hours.

FIG. 3A. Evolution of PL spectra with different emitter QD loading in donor QD matrix. The loading of emitter QD completely quench the PL emission from the donor matrix and enhance the emitter QD band-edge PL intensity. FIG. 3B. PLQE of binary and ternary QD blends with different emitter QD loading in donor QD matrix. For ternary mixing, 40% ZnO NCs mixed with different binary blends. FIG. 3C, PL decay plots for binary and ternary blends upon pulsed excitation with 637 nm light. The curves are fitted with bi-exponential decays. The faster component is ascribed to the emitter QD PL life time whereas the slower component is attributed to the carrier supply lifetime of the photogenerated carriers in the matrix to the emitter QDs. FIGS. 3D and 3E. Schematic diagram of charge recombination in emitter only QD arrays (FIG. 3D) and emitter QDs in donor QD matrix (FIG. 3E).

The black spheres represents the defective QDs in arrays (as channels for non-radiative recombination). The charge collection zone of defective QDs determined by the carrier diffusion length (Ld) are shown as dark grey dashed circles around the QDs. (FIG. 3E) By loading emitter QDs in a donor QD matrix, the number of non-radiative recombination channels per volume decrease and radiative recombination channels increase through charge transfer from donor QDs to emitter QDs (light grey dashed circles). FIG. 3F. The schematic representation of remote trap passivation of PbS QDs through electron transfer from ZnO NCs. The empty traps (white circles) are filled by the electrons of the n-type ZnO NCs.

FIGS. 4A-4F: Photovoltaic performance, quantified trap-state analysis via TAS and Voc dependence of the single (prior art), binary and ternary (present invention) QD blend devices. FIGS. 4A and 4B. Dark and AM1.5 irradiated J-V plot of the three devices under study. Decrease of reverse saturation current is observed in accordance with the $V_{OC}$ evolution from single to ternary blend devices (FIG. 4A). The $V_{OC}$ of the devices increases from single to binary blend and further to ternary blend (FIG. 4B). FIG. 4C. Radiative $V_{OC}$ limit estimation by calculating luminescence EQE of PV device at an applied voltage of $V_{OC}$. Decrease of non-radiative $V_{OC}$ losses observed from single to binary device and further to ternary device. FIG. 4D. EQE of PV devices based on single, binary and ternary QDs. FIG. 4E. Quantification of density of in-gap trap states from TAS analysis. Binary blend shows reduced traps with slight decrease of trap energy (Et). Ternary blend shows significant decrease of traps as well as Et as a result of trap passivation. FIG. 4F. Intensity dependent $V_{OC}$ variation of the devices under study with two different excitation wavelengths (637 nm and 1310 nm). 637 nm laser excites both emitter and matrix PbS QDs whereas 1310 nm light excites only the emitter QDs. The change of $V_{OC}$ from single to binary device is a combined effect of trap passivation and DOS reduction whereas the change from binary to ternary is mainly because of trap passivation.

(FIG. 6A) Radiance and (FIG. 6B) EQE plot for MPA (3-Mercaptopropionic Acid) treated ternary blend based LED. High turn-on (~2.5 V) and much lower EQE indicate lower mobility and charge transport with only MPA treatment compared to the mixed ligand treatments.

FIG. 18: The EQE of the binary LED devices based on emitter QDs and ZnO NCs. The optimized ZnO mixing (40%) improves the LED performance compared to the single device comprising only emitter QDs due to suppression of in-gap trap states and consequent increase in radiative emission efficiency. This is also supported by the PLQE data presented in FIG. 3b. The PLQE of the ZnO NC mixed with emitter QDs increased to 40% compared to 2% for only emitter QD based films. The LED based on 40% ZnO mixed with Emitter PbS QD in a binary blend shows a three-fold improvement in peak EQE (1.8%) compared to only PbS QD based device. Upon further increase of ZnO NC content in the binary blend, the LED suffers from imbalanced transport as there is not a sufficient supply of holes (that are transported through the PbS QD medium) and hence the EQE decreases significantly.

FIGS. 19A and 19B: (FIG. 19A) Schematic of isotropic Emitter QD distribution in matrix; (FIG. 19B) Centre-to-centre distance between two nearest Emitter QDs.

FIG. 20: The inter-dot spacing distribution for emitter QDs in 7.5% binary mixing.

FIGS. 21A and 21B: (FIG. 21A) Schematic of charge carrier tunnelling from emitter to emitter in binary mixing; (FIG. 21B) Transmission probability as a function of barrier width for different barrier height.

(FIG. 24A) Photogenerated charge carrier profile for binary blend in case of 637 nm excitation. (FIG. 24B) Corresponding quasi-Fermi level modification of the device. The major change is coming from the contribution of photogenerated carriers produced by the matrix QDs (Δn2) determined by the integral of GC2 with the Fermi function.

FIGS. 25A and 25B: SCAPS simulation schematic for (FIG. 25A) single and (FIG. 25B) binary devices.

FIGS. 26A and 26B: SCAPS results for (FIG. 26A) single and (FIG. 26B) binary devices. Change of VOC with different illumination observed in case of binary devices.

(FIG. 29A) Emission spectra of the reference sample; (FIG. 29B) The instrument response function for PL measurements.

DETAILED DESCRIPTION

Figure 3A:
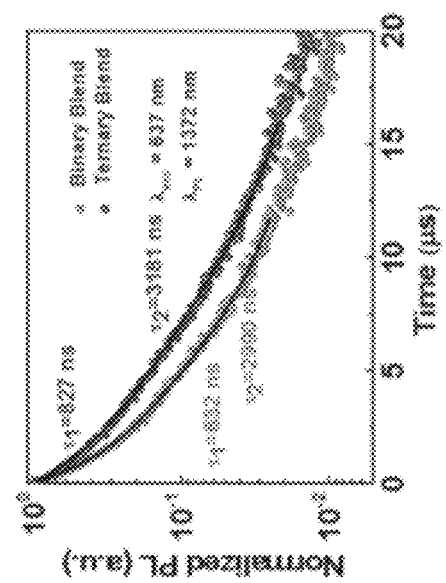
FIGS. 3A-3F: PL dynamics of QD blends.

In contrast to prior reports, the present inventors posit that instead of relying solely on chemical passivation of the CQD emitting species, the use of a remote charge passivation mechanism induced from an appropriate matrix would be more robust and efficient in reducing trap state density in the CQDs [28,29]. Unlike prior approaches [21,26], the present invention is based entirely on CQD materials. In doing so, the present invention exploits the advances made in QD solids in terms of mobility and carrier diffusion length thanks to the progress in photovoltaic devices [30-32], in which mobilities and carrier diffusion lengths in excess of ~$10^{-2}$ cm$^2$ V$^{-1}$ s$^{-1}$ and 230 nm respectively, have been reported, fulfilling the needs for efficient carrier transport in the typical thinner-than-solar-cells, LED devices.

Two main embodiments have been proposed for the light emitting device of the present invention, corresponding to two LED architectures, and are described in the present section for some specific materials for the different layers of the device which has been built and tested by the present inventors, according to two corresponding embodiments, i.e. two prototypes have been built. However, although not described in the present section, other alternative materials (for example for the QDs of the active light emitting layer) are also possible and covered by the present invention, as long as they are appropriate for implementing the present invention, as defined in the attached claims.

As shown in FIGS. 1A-1D, the device of the present invention comprises:
- a first electrode E1 formed by a first electrically conductive layer arranged over a substrate (not shown);
- an electron injecting and hole blocking layer le arranged between the active light emitting layer and the first electrode E1;
- an active light emitting layer A arranged over the first electrically conductive layer, and that comprises a host matrix and light emitting quantum dots embedded there within;
- a hole injecting and electron blocking layer lh arranged between the active light emitting layer A and the second electrode E2: and
- a second electrode E2 formed by a second electrically conductive layer arranged over said active light emitting layer.

For one of the two illustrated embodiments (FIGS. 1A and 1C) the active light emitting layer A of the LED comprises a binary blend of small PbS QDs with large bandgap serving as the carrier supplier for the large PbS QDs with smaller-bandgap that act as the carrier acceptor and emitting species, and for the other illustrated embodiment (FIGS. 1B and 1D) the active light emitting layer A comprises a ternary blend formed by the binary blend with the addition of ZnO nanocrystals (NCs), which serve as a high-bandgap electron-rich transporting medium and that is employed to further balance carrier injection in the active region as well as to further passivate remotely the traps of the PbS QDs [28].

The ligand exchange scheme that was employed for the active light emitting layers A was based on a mixture of zinc iodide and 3-mercapto-propionic-acid (MPA) as it delivered previously solar cells with long carrier diffusion lengths and high open circuit voltage [33] (see "Methods" subsection below for the details of device fabrication). Both structures also employ a ZnO front layer (le) as an electron injection, hole-blocking layer and 1, 2-Ethanedithiol (EDT) treated small PbS QD layer (lh) on top that facilitates hole injection and electron blocking at the back interface. The thickness of each of the layers used in high performance devices considered in the built prototypes are illustrated in the cross/sectional focused ion beam SEM images in FIGS. 1C and 1D for the binary and ternary blends respectively. Typically, the optimal thickness of electron injecting (le), active (A) and hole (lh) injecting layers are around 80 nm, 60 nm and 70 nm respectively. The TEM images of FIG. 1 illustrate the effective blending of these QD species at the nanoscale and support the nature of the nanocomposite active layer A. The corresponding band diagrams of the constituent materials used in these devices are shown in FIG. 1E, taken from UV photoelectron spectroscopy measurements (UPS). According to this, both ZnO NCs and small PbS QDs serve as a type-I heterostructure with the emitting large PbS QDs. The small PbS QD matrix forms a marginal type-I heterostructure with the large PbS QD emitters in which the band offset confinement for both electrons and holes is between 0.1-0.2 eV. Based on the band diagram electron transport and injection takes place within the ZnO NC and the small PbS QD matrix given their matched conduction band levels, whereas hole transport is facilitated largely via the small PbS QD matrix.

FIG. 2A shows the radiance of the binary and ternary blend-based LED devices with applied bias voltage. A control device was built comprising only large PbS QD as the active layer (i.e. single blend of QDs), and is plotted for comparison. All devices showed very high radiance of ~9 W sr$^{-1}$ m$^{-2}$ at 3.5 V, which is more than 50% higher compared to the previously reported PbS QD based IR LEDs [19,21]. It is noteworthy that the turn-on voltage for both binary and ternary blend devices is around 0.6 V, i.e. below the bandgap of emission, while the turn-on voltage of the control device was 0.87 V, i.e. matching closely the bandgap of emission (note: we have considered 1 nW radiance as the turn on power). The electroluminescence spectra with different values of voltage bias for the ternary device are shown in FIG. 2B with clear band-edge electroluminescence emission at sub-band gap voltages. This is the lowest turn-on voltage ever reported for a PbS QD based LED. Although this below-bandgap turn-on value is not thermodynamically feasible in the absence of multi-carrier processes, it has been reported previously for polymer [35] and QD based LEDs [8], attributed to Auger assisted charge injection processes. According to this, the low-energy barrier for electron injection results in electron accumulation at the active layer and hole transporting layer (HTL) interface which can fulfill the condition for Auger assisted charge injection [8,35-37]. In the present invention, this is partially attributed to the improvement of mobility and trap passivation with the mixed ligand treatment employed herein as well as the use of bulk heterojunctions.

Figure 6A:
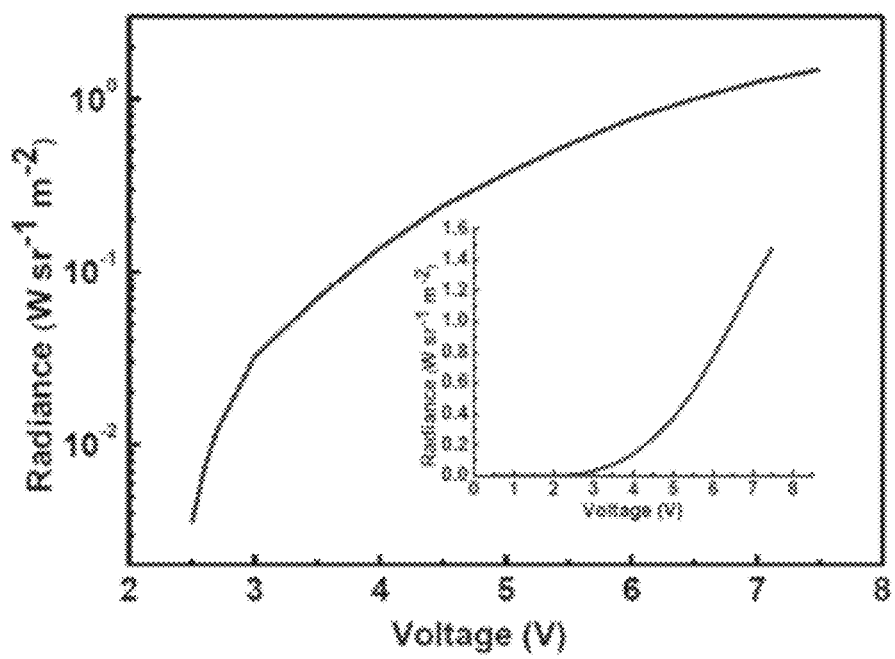
FIGS. 6A and 6B.
Figure 6B:
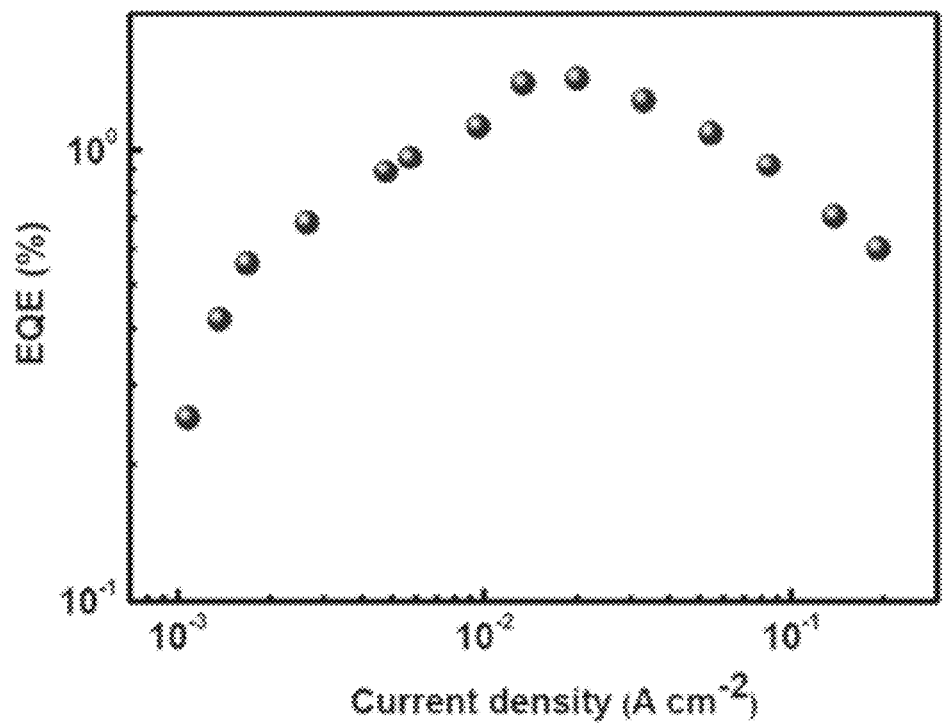

To examine the hypothesis about the role of the ligand passivation a ternary blend active layer device using only MPA as the ligand (MPA ligand exchange yields carrier mobility lower than the ZnI$_2$_MPA treatment) was fabricated. As shown in FIGS. 6A and 6B, the device showed a much higher turn-on voltage (2.5 V) and lower radiance compared to the devices reported in this document. An additional plausible mechanism can be assigned to Auger assisted recombination in the small PbS QD matrix in which hole transport takes place via midgap delocalized states [38,39] and recombination with electrons transfers the energy to the remaining holes in those states enabling them to move to the valence band and subsequently inject into the emitting QDs.

Figure 5:
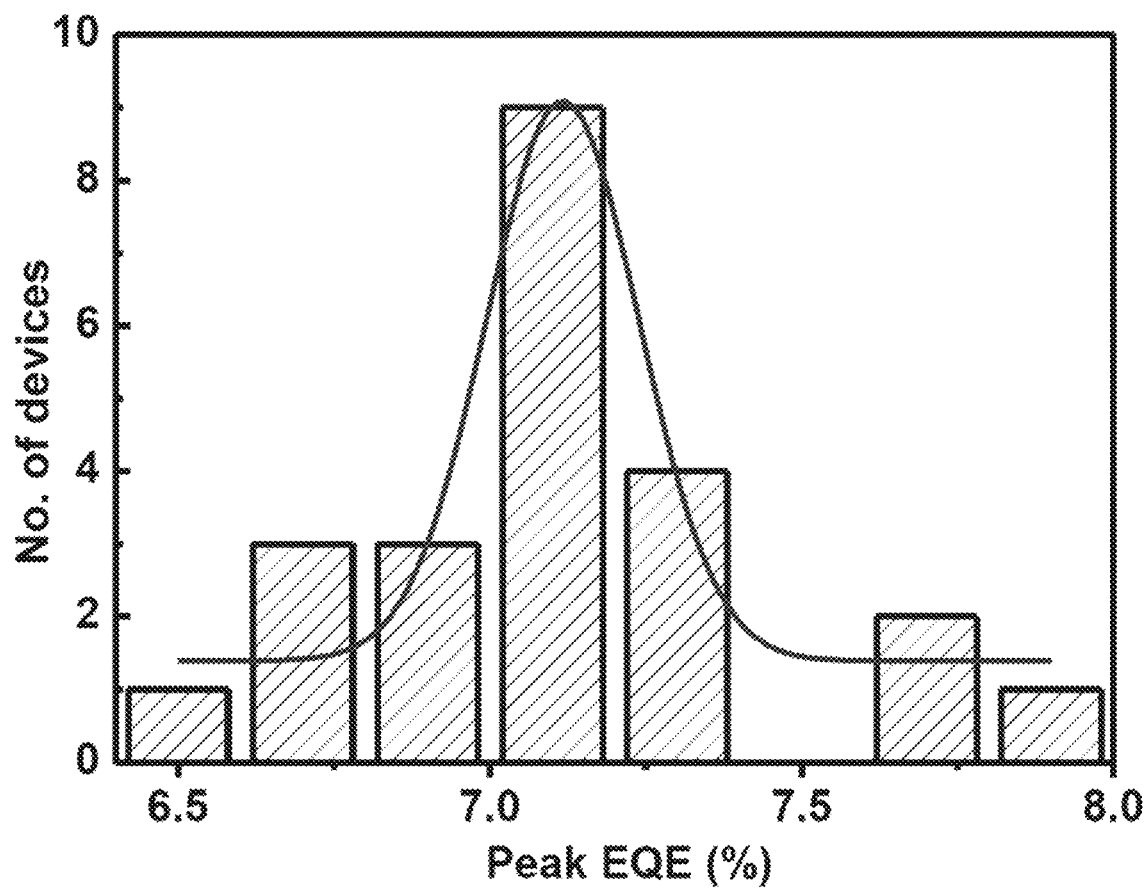
FIG. 5: Peak EQE statistics for ternary blend based devices. A total of 23 working devices were considered for the statistics. The variation of emitting QD wavelength for different device is within ±10 nm.

Despite the similar radiance measured across those three LED devices, a large difference in their driving currents was recorded, with the control (single) device yielding very high leakage current that progressively decreases in the binary and ternary blend cases (FIG. 2C). This has a significant effect in the EQE of the LEDs as shown in FIG. 2D. The peak EQE of the ternary device reached 7.87% (average: 7.11±0.30%; FIG. 5) compared to 0.38% ((0.3±0.07)%) for the single and 4.5% ((4.12±0.29)%) for binary QD based devices. The ternary blend based devices have reached record high EQE for CQD LEDs emitting at 1400 nm wavelength. Previously reported best devices showed the peak EQE around 5% covering a similar spectral range [10,21,23]. This is attributed to the trap passivation and the reduction of leakage current in the blend-devices. The high EQE recorded in the binary and ternary blend devices, taken together with the low turn-on voltage results also in unprecedentedly high PCE. FIG. 2E plots the PCE of the LED devices from which the ternary blend based device outperforms with a peak PCE as high as 9.3%, a nearly twofold improvement over the previous record [21]. The synergistic use of both PbS QD matrix dots and ZnO NCs has been instrumental in reaching high EQE. Binary control devices comprising PbS QD emitters with ZnO NCs have reached an optimum EQE of 1.8% (FIG. 18). In course of device optimization and in order to demonstrate the versatility of the present invention, the present inventors have fabricated and measured several prototypes of the device of the present invention for which the active light emitting layer A comprises a ternary blend of QDs, with optimized blend ratio varying the bandgap of the PbS QD matrix as well as the bandgap of the PbS QD light emitters, the results of which are summarized in Table 1 below.

TABLE 1

EQE values of LEDs varying the PbS QD matrix and the PbS QD emitter bandgaps

|  |  | Average EQE (%) |
|---|---|---|
| PbS QD matrix bandgap 1.49 eV/PbS QD emitter bandgap: | 0.91 eV | 6.7 ± 0.4 |
|  | 0.89 eV | 7.11 ± 0.30 |
|  | 0.85 eV | 4.95 ± 0.40 |
| PbS QD emitter bandgap 0.91 eV/PbS QD matrix bandgap: | 1.24 eV | 3.26 ± 0.22 |
|  | 1.31 eV | 4.94 ± 0.32 |
|  | 1.49 eV | 6.7 ± 0.4 |

Figure 7A:
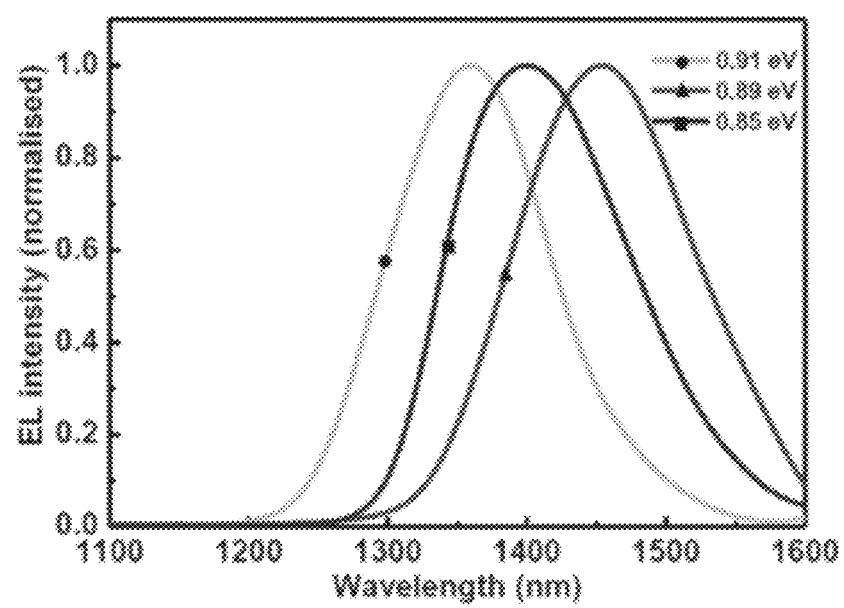
FIGS. 7A and 7B: Electroluminescence (EL) spectra of ternary devices based on (FIG. 7A) different emitter QDs in similar donor matrix and (FIG. 7B) same emitter QDs in different donor matrix.
Figure 7B:
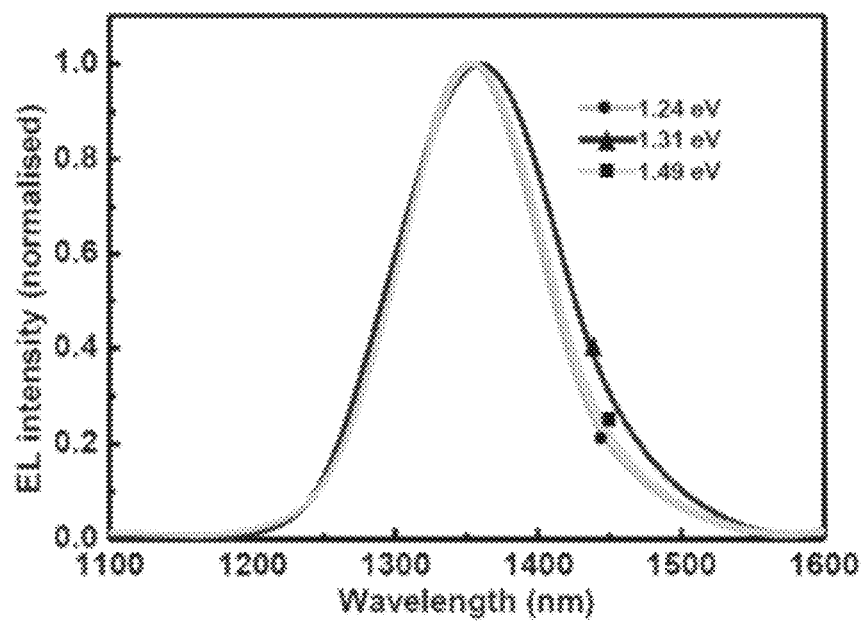

The electroluminescence spectra of various emitting PbS QD bandgaps are shown in FIG. 7A. The variation of the PbS QD matrix bandgap (Table 1 and FIG. 7B) revealed that optimized EQEs are achieved with increasing the bandgap of the PbS QD matrix, likely due to more efficient charge transfer to the emitting PbS QDs and increased confinement in the emitting QDs due to the larger band offset with the surrounding PbS QD matrix. Considering the fact that the device of the present invention are based entirely on CQD components with reported high stability [32,40], the stability of the best performing device has been tested under a constant applied current over a period of 48 hours. The radiance and the EQE of the device are highly stable throughout the course of the test as shown in FIG. 2F, especially considering that the devices were fabricated and characterised in ambient air conditions without any encapsulation.

Figure 3B:
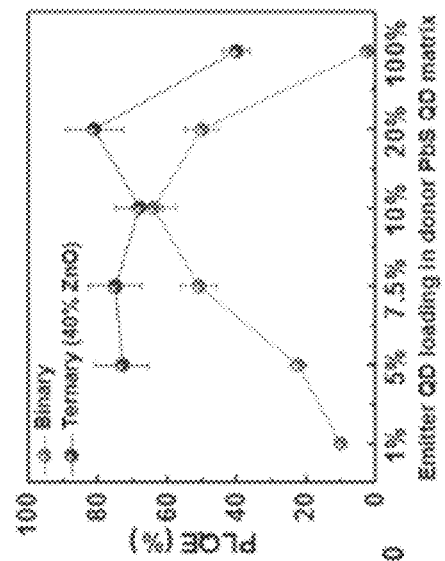
Figure 3C:
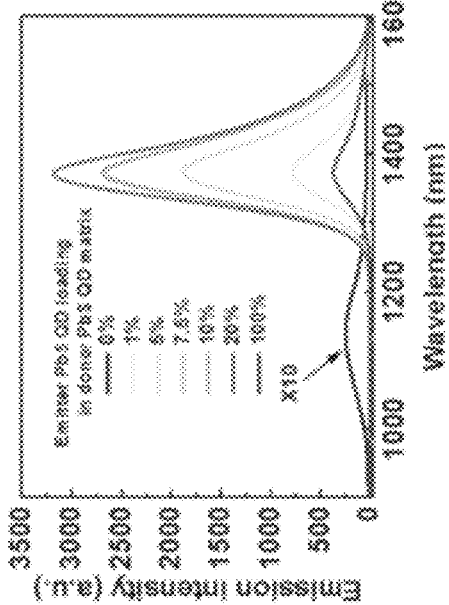
Figure 3F:
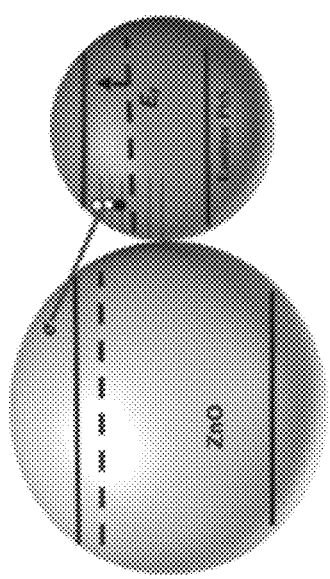
Figure 3E:
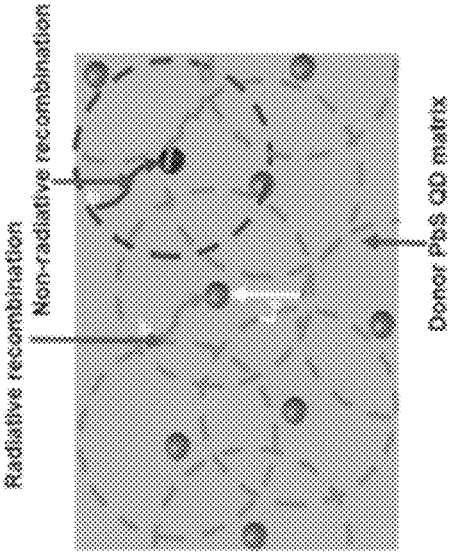
Figure 3D:
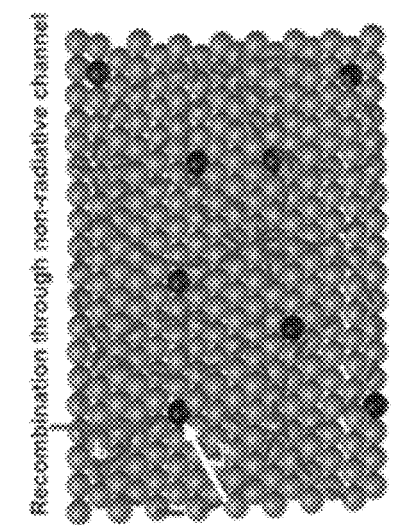

The origin of this high EQE lies on very high PLQE of the QD films employed and the present inventors therefore explored in more depth the role of the host matrix on the PLQE of the emitting QD species. FIG. 3A plots the PL spectra for the ligand exchanged binary blend films varying the loading of emitting QDs in the small PbS QD matrix. The absence of PL emission from the matrix QDs upon blending corroborates highly efficient carrier transfer to the emitting QDs. This finding is in accordance to prior reports in which such high charge transfer has been ascribed to the increased coupling strength enabled in ligand exchanged electronically coupled QD solids [41]. Here, it has been made use of this effect to develop QD solids with considerably high PLQE under the following rationale: For a given density of poorly emitting (defective) large PbS QDs and a given QD film volume we envision a much higher PLQE when the large PbS QDs are introduced into a small PbS QD matrix, due to the proportionally lower number of defective large PbS QDs existent in the same volume. This hypothesis is valid when the matrix is absorbing at the optical excitation wavelength and possess long carrier diffusion lengths to supply the emitting QD species with electrons and holes. The schematic representation of this mechanism is illustrated in FIGS. 3C and 3D. PLQE measurements of such binary blends are in agreement with the proposed mechanism. FIG. 3B plots the PLQE values of the binary blends varying the emitter QD loading in the host PbS QD matrix. An optimum PLQE of 60% is recorded for a loading of 10% of large PbS QDs in a small PbS QD host matrix, drastically increased over the 2.3% PLQE of the neat large PbS QD film. This is a remarkably high PLQE considering that refers to electronically conductive ligand exchanged QD solids. Such high PLQE values for the binary case should also express in long PL lifetimes. The transient PL of the 7.5% loaded binary blend, shown in FIG. 3C, yields a bi-exponential decay with corresponding lifetimes of 632 ns and 2.99 µs. Fitting values are summarized below.

The PL decay of binary and ternary films (shown in FIG. 3C) plots are fitted with bi-exponential decay curve with two pre-exponential weightage of $a_1$ and $a_2$ corresponding to the decay time of $\tau_1$ and $\tau_2$. The emitter only QD based film has very low PLQE and the decay was beyond the resolution of the system (300 ns). Table 2 below summarizes the fitting values.

TABLE 2

PL decay parameters for binary and ternary blend based films

| Sample | $a_1$ | $\tau_1$ (ns) | $a_2$ | $\tau_2$ (ns) | $\tau_{av} = \dfrac{a_1\tau_1^2 + a_2\tau_2^2}{a_1\tau_1 + a_2\tau_2}$ (ns) |
|---|---|---|---|---|---|
| Binary blend | 0.50 | 632 | 0.42 | 2990 | 2515 |
| Ternary blend | 0.41 | 827 | 0.52 | 3181 | 2780 |

Figure 8:
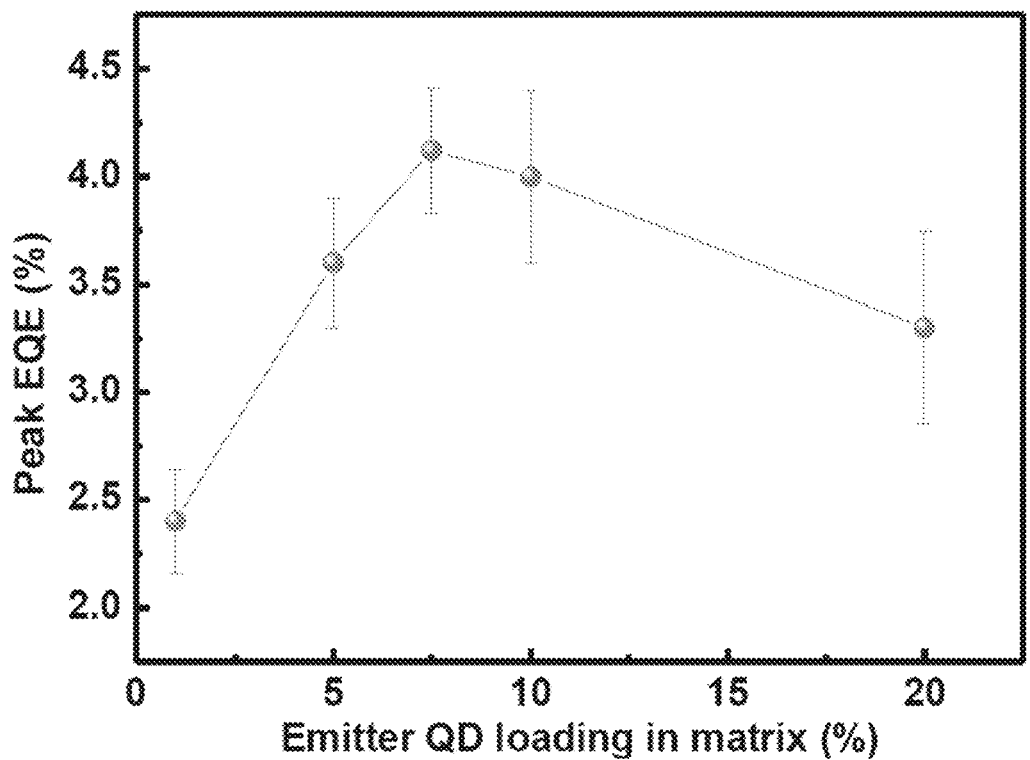
FIG. 8: Peak EQE of the binary devices with different emitter QD loading.

The first decay is attributed to the intrinsic PL lifetime of the emitter QDs whereas the longer component is associated to the carrier supply time of photo-generated carriers in the matrix of the binary blend to diffuse and excite the emitter QDs. The shorter component of 632 ns is in agreement with the recorded PLQE values considering that the ideal radiative lifetime of PbS has been reported on the order of 1 µs [42,43]. Increasing the amount of emitter QDs in the matrix reduces the PLQE as a result of increasing the probability of non-radiative recombination in the defective emitter QDs. Whereas decreasing the amount of emitter QDs in the matrix reduces the PLQE as a result of increasing the probability of non-radiative recombination in the host matrix considering a carrier diffusion length around 70 nm in the small PbS QD matrix [41]. Although the 10% emitter QD based binary blend yields the best PLQE, it does not yield the best EQE among different binary blends (FIG. 8). We attribute this to the trade-off between efficient balanced charge injection and PLQE.

Figure 9:
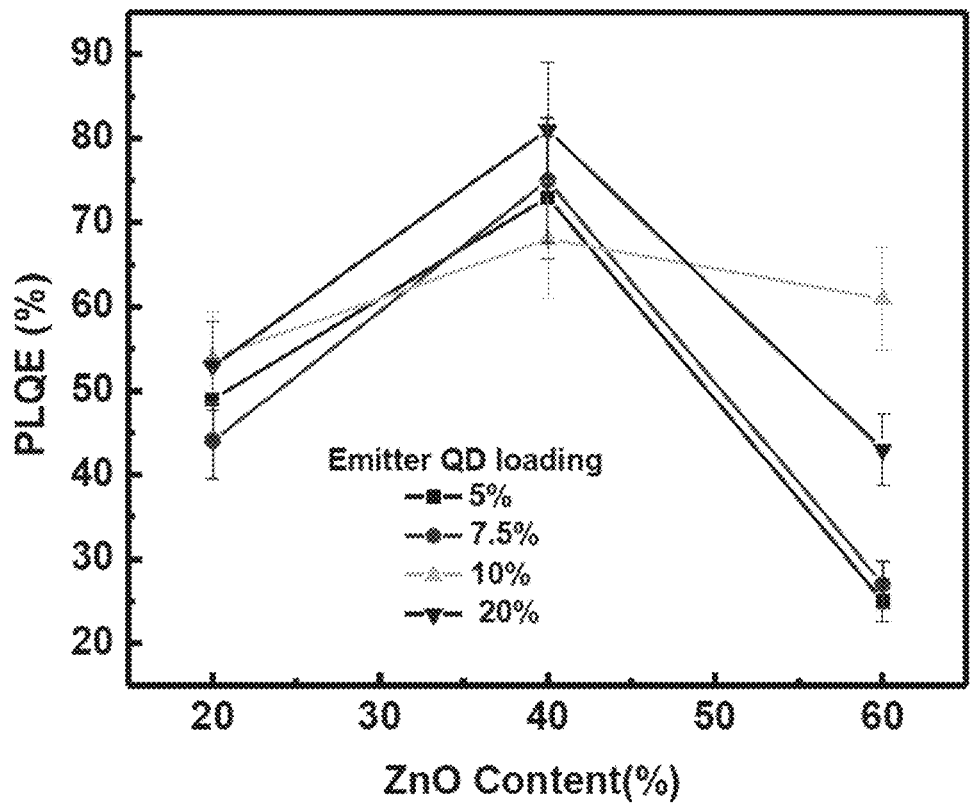
FIG. 9: PLQE of ternary devices with different binary blend combinations and ZnO nc loading.
Figure 10:
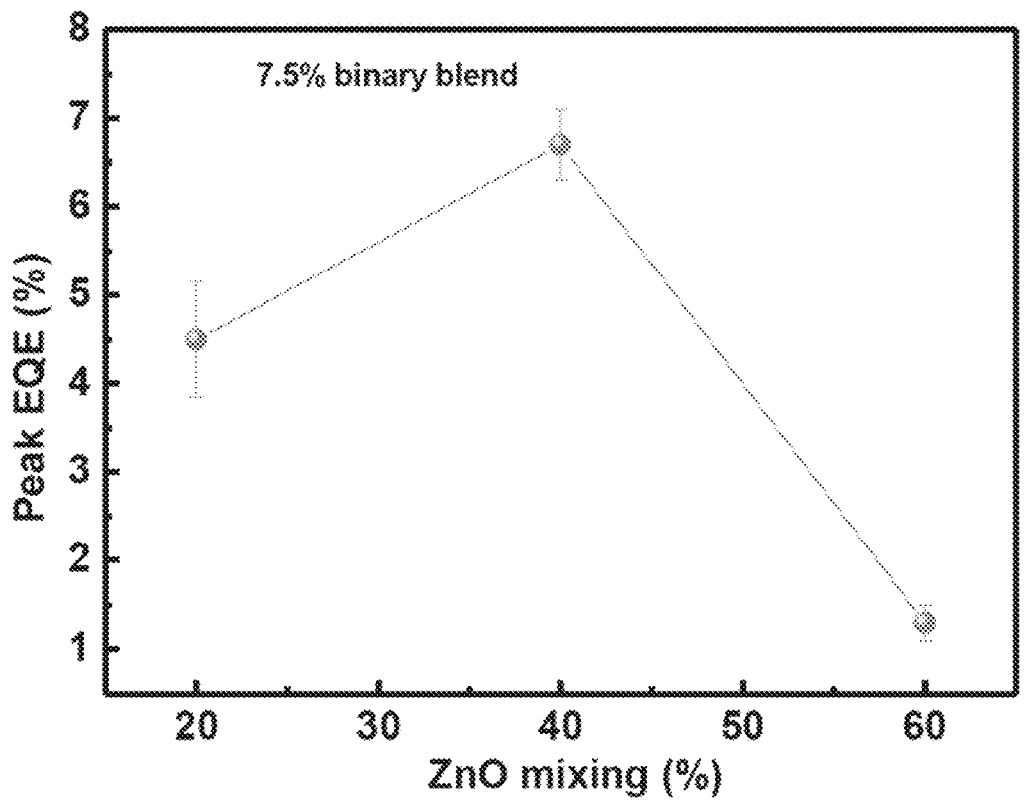
FIG. 10 Peak EQE of the LED devices based on the different ZnO nc loading in 7.5% emitter QD based binary blend.
Figure 11:
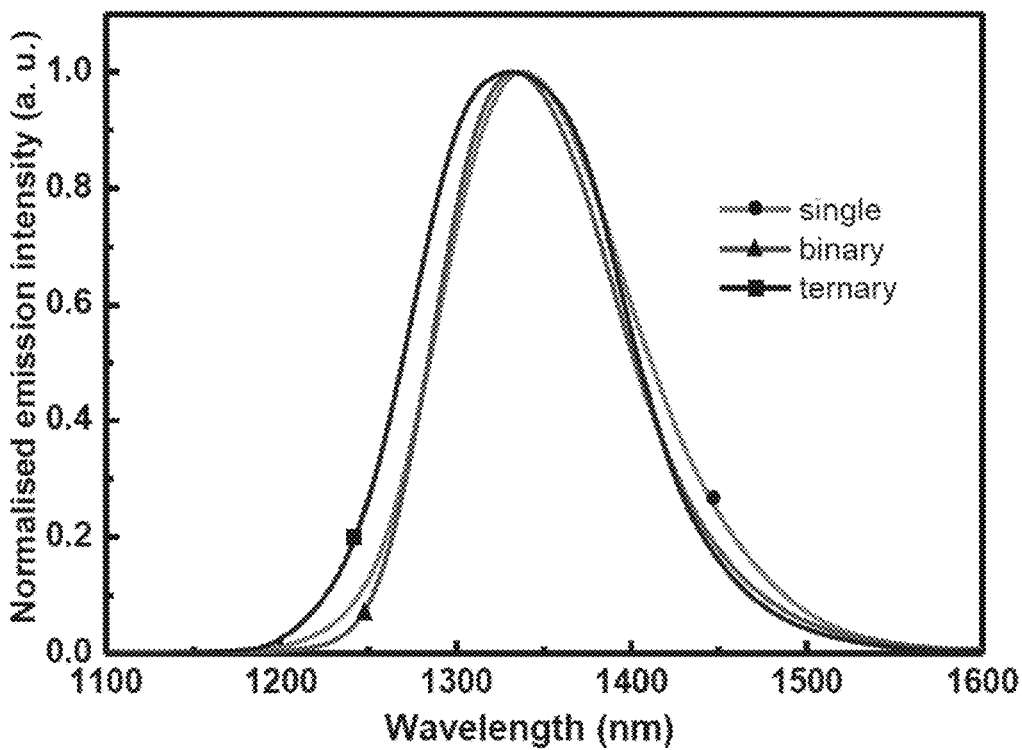
FIG. 11 PL spectra of single, binary and ternary blends. Loading of QDs does not modify the spectral shape drastically.

The synergistic use of ZnO NCs, in addition to improving balance of charge injection (as shown in FIG. 2C), offers the additional benefit of remotely passivating electron traps in the PbS QD emitters. The electrons of the n-type ZnO NCs, when in the vicinity of PbS QDs with electron traps available for population are used to electrically neutralize (passivate) those electron traps and result in higher radiative recombination efficiencies [28,29] (FIG. 3F). The PLQE of the ternary blend films as a function of PbS QD emitter loading in the PbS QD host matrix at a given ZnO loading of 40% is presented in FIG. 3B. According to this, a further increase in PLQE approaching a value of 80% for a loading of 20% of the emitting QD species is observed. The PLQE of the ternary blends with different PbS QD and ZnO ratios are shown in FIG. 9. In all types of PbS QD combinations, 40% ZnO loading in ternary blend gives the best PLQE and also the best EQE in LED devices, as shown in FIG. 10. It is noteworthy that the loading of emitter QDs in donor matrix or addition of ZnO NCs does not cause any spectral shift in the PL (FIG. 11), suggesting thus that the observed increase in the PLQE of the emitting PbS QDs is not due to suppression of energy transfer amongst them, as supported by the 3D modelling provided below.

3D Modelling of the QD Distribution in Closed Packed Binary System:

To exclude excitation mechanisms of the emitter QDs via Energy transfer from the matrix or from neighbouring emitter QDs the present inventors have performed a simple analysis of estimating the emitter QD inter-dot distance first in an ideal case where the QDs have been homogeneously and isotropically dispersed in the matrix and also by measuring their distance from the TEM images of the close-packed ligand exchange film shown in FIG. 1A.

A. Theoretical Calculation of Homogeneously and Isotropically Dispersed Emitter QDs in a QD Matrix (Binary Case)

The average diameter of the emitter QDs is 4.66 nm (estimated from excitonic absorption peak).

Considering the QDs as perfect sphere Emitter QD Volume will be:

$$V \approx \frac{4\pi}{3}(2.33 \times 10^{-7})^3 \text{ cm}^3$$

So, the number of No. of emitter QD per 1 cm³ volume $$(N) \sim \frac{0.74}{V} \sim 1.4 \times 10^{19} \text{ cm}^{-3}.$$

Considering the QDs are distributed in isotropic way upon mixing as shown in FIG. 19, one can estimate the volume which contains each of the QD in the matrix.

In 7.5% binary mixing, the number of emitter QD per 1 cm³ will be $1.1 \times 10^{18}$ cm$^{-3}$ The volume of the cube containing each of the emitter QD as shown in FIG. 19 can be calculated as, $1/(1.1 \times 10^{18}) \approx 9.1 \times 10^{-17}$ cm³

The edge of each cube will be ~ $\sqrt[3]{9.1 \times 10^{-17}}$ ~44.9 nm

So, the center to center distance between two emitter QD in the matrix is $d_{th}$~44.9 nm.

B. Determining the Actual Emitter Inter Dot Distance from TEM Image in the Binary Blend.

The present inventors have also measured the actual emitter inter-dot spacing from the TEM image of FIG. 1(a) for 7.5% emitter in the binary blend. The distribution is shown in FIG. 20. The inter-dot spacing vary from 7-46 nm which is larger than the tunnel width as well as Förster radius.

To study the possibility electronic cross-talk among emitter QDs, we have considered two different mechanisms, first via carrier tunnelling and second through exciton transfer:

(1) Charge carrier tunnelling: Considering the band diagram of Emitter QDs in donor matrix as shown in FIG. 21A, it is possible to charge transfer through quantum mechanical tunnelling. The classical tunnelling probability for this kind of system is given by [54].

$$T = \left(1 + \frac{\sinh^2 \beta a}{(E/V)(1-E/V)}\right)^{-1} \quad \text{(S1)}$$

Where a is barrier width and $$\beta = \sqrt{\frac{2m(V-E)}{h}}$$

V is barrier height and E is the energy of the electron. The present inventors consider three different barrier height (V-E) and plot as a function of barrier with (dot-to-dot distance here) as shown in FIG. 21B.

The most realistic barrier height for the present case is around 0.1 eV according to the flat band diagram shown in FIG. 1E. It shows 50% tunnelling probability at 0.98 nm barrier width and less than 1% tunnelling probability around 4.3 nm.

(2) Förster Resonance Energy Transfer (FRET): Considering the standard FRET equation of energy transfer between two species to find out the Förster radius2 ($r_0$, defined as the distance for 50% energy transfer between two species):

$$r_0^6 = \frac{9(\ln 10)\kappa^2 \Phi_D}{128\pi^5 n^4 N_A} J \quad \text{(S2)}$$

Where κ is the dipole orientation factor and given by $\kappa^2 = \frac{2}{3}$ for our system. $\Phi_D$ is the donor emission efficiency, n is refractive index (4.2 in this case), $N_A$ is the Avogadro's number. J is the overlap integral defined as.

$$J = \int_0^\infty f_D(\lambda) E_A(\lambda) \lambda^4 d\lambda \quad \text{(S3)}$$

Where $$f_D(\lambda) = \frac{F_D(\lambda)}{\int_0^\infty F_D(\lambda) d\lambda};$$

Figure 22:
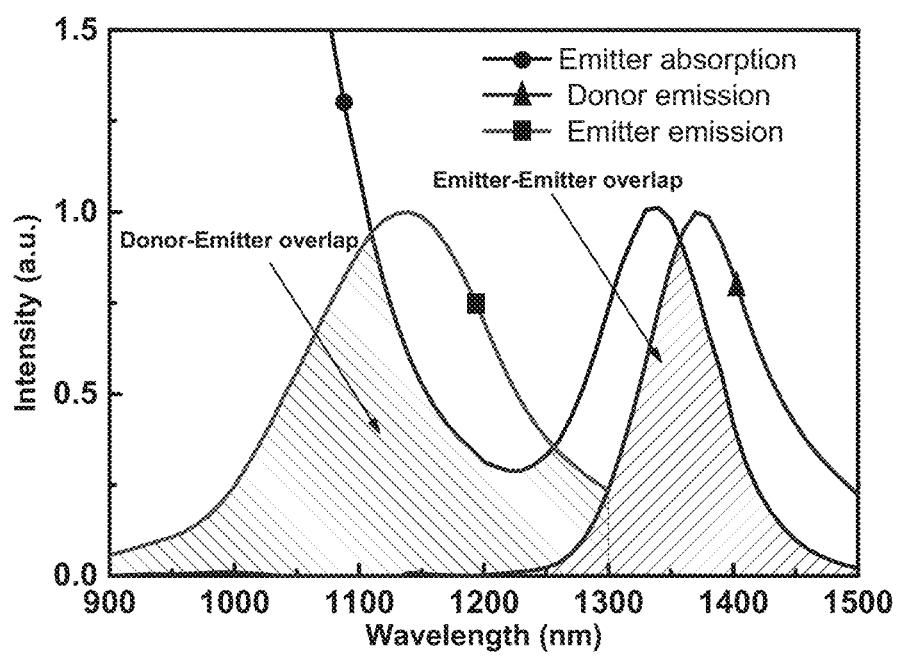
FIG. 22: Absorption plot of emitter dots and emission plots of donor dots and emitter dots.

$F_D(\lambda)$ is the donor emission spectra and $E_A(\lambda)$ is the acceptor absorption spectra. The overlap of donor emission and emitter absorption as well as emitter emission and emitter emission is shown in FIG. 22 to estimate the $r_0$ in case of energy transfer between donor matrix and emitter QD as well as between two nearest emitter QDs. The results are summarized in Table 3 below. The $r_0$ for energy transfer between the donor matrix and emitter QDs is 1.6 nm whereas the $r_0$ for energy transfer between two neighbouring emitter QDs in a binary blend is 3.5 nm.

TABLE 3

FRET parameters for donor-emitter and emitter-emitter energy transfer

| System | Overlap integral ($nm^4cm^{-1}M^{-1}$) | $\Phi_D$ | $r_0$ (nm) |
|---|---|---|---|
| Donor-Emitter | $1.51 \times 10^{19}$ | 0.5% | 1.6 |
| Emitter-Emitter | $2.06 \times 10^{19}$ | 50% | 3.5 |

By considering these length scales of these two distinct mechanisms plotted in FIG. 20 along with the distribution of inter-dot distances, the present inventors reach to the conclusion that it is unlikely that such processes take place.

Figure 12:
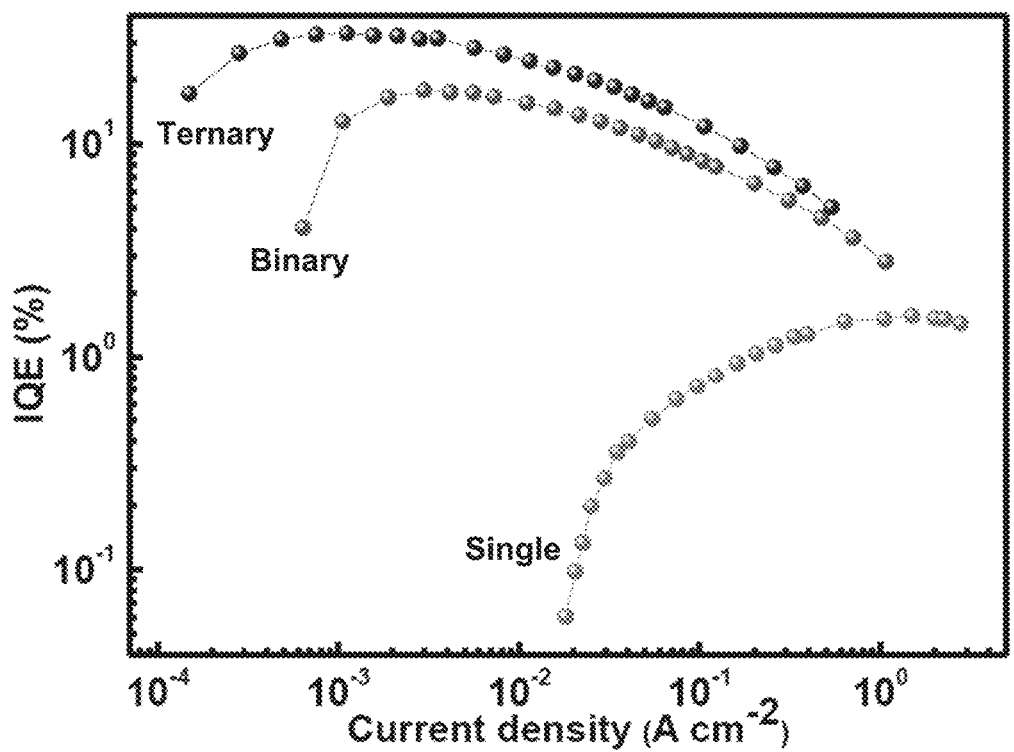
FIG. 12 Internal quantum efficiency (IQE) of single, binary and ternary devices calculated using a previously reported method1. The combined refractive index of ZnO, ITO and glass was taken as 1.45. The ternary blend based device showed a record peak 33% IQE for IR LEDs.

These very high PLQE values shown in FIG. 9 are also in line with the quantum efficiency values reported in the LED devices. In FIG. 12, the internal quantum efficiency (IQE) of the LED devices is plotted defined as the ratio of photon generated inside the device to the injected charge carriers. The ternary blend devices yield a peak IQE value of 33.3% whereas the binary blend shows IQE of 17.5%. The improvement in EQE and thereby IQE is nearly twofold, i.e. much higher than the improvement in the PLQE. This shows that the LED devices of the present invention built for the here described tests are current injection limited and further improvement in EQE can be within reach through device optimization. It also supports the hypothesis that the use of ZnO serves a twofold role: it improves the trap passivation and PLQE, as well as improves the balance of carrier injection since at the optimal LED configuration (40% ZnO loading). Similarly to the binary case, transient PL measurement of the ternary system exhibits a bi-exponential PL lifetime with the first component, associated to the radiative lifetime, on the order of 827 ns and the second one longer lived, associated to the carrier diffusion from the matrix PbS QDs to the emitter QDs, on the order of 3 µs.

These high PLQE values are also in line with the quantum efficiency values reported in the LED devices. In FIG. 12, the internal quantum efficiency (IQE) of the LED devices defined as the ratio of photon generated inside the device to the injected charge carriers is plotted. The ternary blend devices yield a peak IQE value of 33.3% whereas the binary blend shows IQE of 17.5%. The improvement in EQE and thereby IQE is nearly twofold, i.e. much higher than the improvement in the PLQE. In Table 4 below the different efficiency factors that determine the EQE of an LED according to the following equation [21] are summarized:

$$IQE = PLQE \times \eta_{carrier\ supply} \quad (1)$$

TABLE 4

Summary of the LED performance parameters for different devices

Figure 14A:
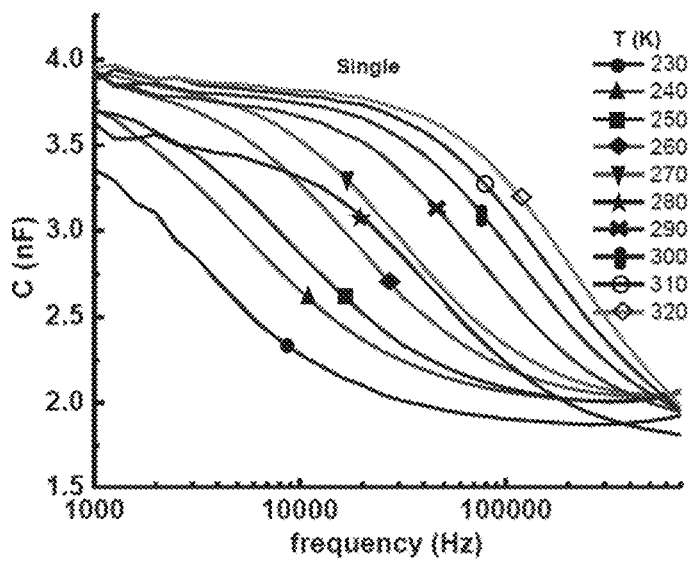
FIGS. 14A-14C: Frequency dependent capacitance plot for (FIG. 14A) single, (FIG. 14B) binary, and (FIG. 14C) ternary devices.
Figure 14B:
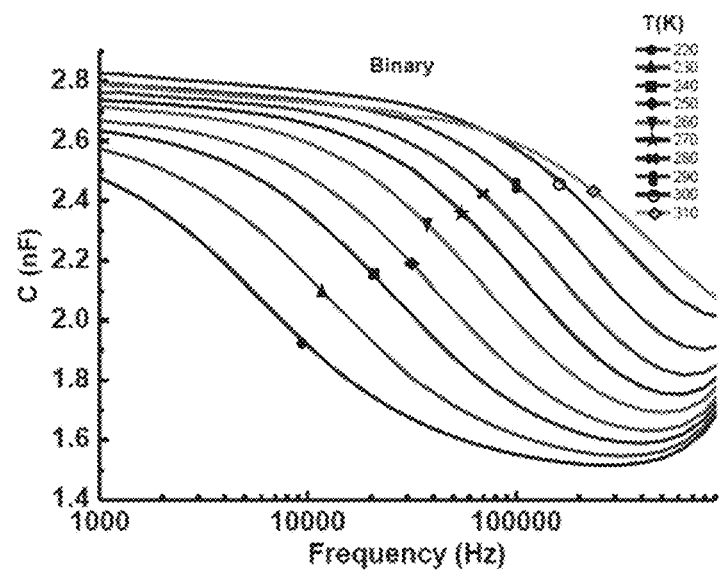
Figure 14C:
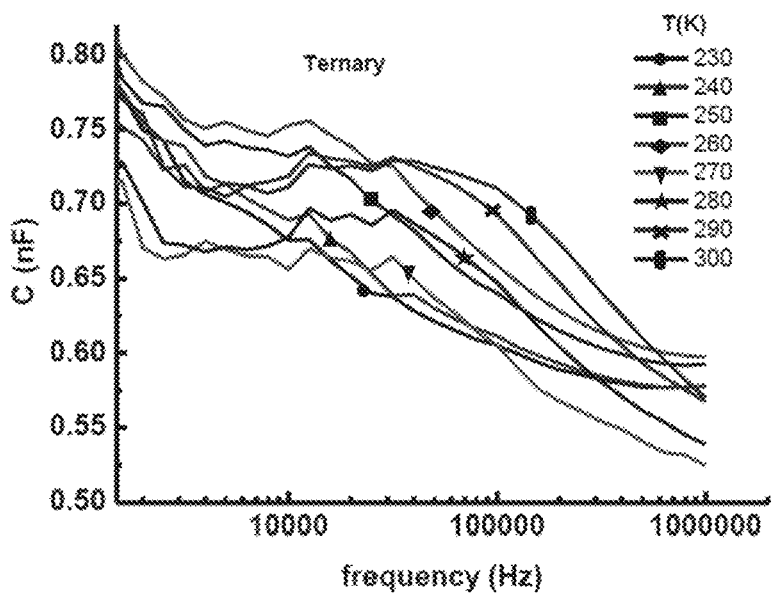

| Device | PLQE (%) | IQE (%) | $\eta_{carrier\ supply}$ (%) | EQE (%) |
|---|---|---|---|---|
| Single | 2.3 | ~168 | ~73 | 0.4 |
| Binary | 51 | ~18.9 | ~37 | 4.5 |
| Ternary | 75.0 | ~33.3 | ~44 | 7.9 |

Where carrier supply efficiency ($\eta_{carrier\ supply}$) measures how efficiently balanced carrier injection takes place and transported at the active layer of the LED. IQE is estimated as per FIGS. 14A-14C using the experimentally determined EQE and the optical loss model. The experimentally determined values of IQE and PLQE allow us to estimate the $\eta_{carrier\ supply}$ of the three classes of devices. While the single LED yields the highest carrier supply efficiency its performance is limited by the low PLQE of the active layer. The binary LED improves on the PLQE factor yet suffers from low carrier supply to the emitter QDs. The ternary system yields a more efficient carrier supply over the binary along with higher PLQE leading to an overall higher EQE. This shows that our current LED devices are carrier supply limited and further improvement in EQE can be within reach through device optimization. It also supports the hypothesis that the use of ZnO serves a twofold role: it improves the trap passivation and PLQE, as well as improves the balance of carrier injection at the optimal LED configuration (40% ZnO loading).

A highly performing LED material, i.e. one having very high PLQE, is expected to be the ideal material for solar cell applications in demonstrating open circuit voltage ($V_{OC}$) very close to the radiative limit [44-46]. Having recorded such high PLQE values in electrically conductive QD solids in the present document, this expectation is also tested herein. The present inventors have therefore constructed, according to a further aspect of the present invention, photovoltaic (PV) cells based on the architectures considered previously for the LED devices of the present invention, essentially mimicking the LED structures with instead much thicker active layer A to facilitate high light absorption. The thickness of electron transporting, active and hole transporting layers were around 40 nm, 220 nm and 30 nm respectively and the PV structure followed a typical CQD solar cell [47]. The dark J-V characteristics, plotted as an inset of FIG. 4A, provide initial features of suppressed recombination upon blending, as evidenced by significantly lower reverse current of the blended-layer diodes compared to the single QD-layer diode case. The J-V curves of those cells under simulated AM1.5 solar illumination is shown in FIG. 4B. The $V_{OC}$ of the binary device increased to 0.59 V from 0.39 V of the single QD based device, which is a typical $V_{OC}$ value for PbS QD solar cells of the same bandgap [32]. The large $V_{OC}$ deficit (defined as the deficit of $V_{OC}$ from the bandgap voltage) for PbS QD based solar cells is believed to be a result of significant presence of non-radiative, in-gap traps [48]. The increased $V_{OC}$ (and subsequent decrease in $V_{OC}$ deficit) can therefore stem from reduced trap state density in accordance to the drastically improved PLQE values recorded for the binary blend films (FIG. 3B). The addition of ZnO further improves $V_{OC}$ to a value of 0.69 V for the ternary blend device. This is a notably large value of $V_{OC}$ that approaches the radiative limit [41] considering the fact that the solar cell harnesses photons with energies down to 0.92 eV. The radiative $V_{OC}$ limit of the PV devices was calculated following standard analysis [44,45], as described below with reference to FIG. 13.

Radiative $V_{OC}$ Limit Calculation from the Luminescent EQE of the Solar Cell:

Radiative $V_{OC}$ can be calculated from the luminescent EQE of the PV devices [41,42]. The radiative $V_{OC}$ can be expressed as, $$V_{OC,rad} = \frac{kT}{q} \ln\left(\frac{J_{SC}}{J_{em}}\right) \quad (S4)$$

Where $J_{SC}$ is the short circuit current density and $J_{em}$ is the emission current density. The luminescent EQE of the device can be given as, $$EQE_{LED}(V) = \frac{J_{em}(V)}{J_{inj}(V)} \quad (S5)$$

$J_{inj}$ is the injection current density of the device. From Shockley equation, the following expression can be written $$J_{em}(V) \approx J_{em}\exp\left(\frac{qV}{kT}\right) \quad (S6)$$

At $V_{int}=V_{OC}$, equation (S2) can be rewritten using equation (S3) as, $$\ln(EQE_{LED}(V_{OC})) = \frac{qV_{OC}}{kT} + \ln\left(\frac{J_{em}}{J_{SC}}\right) \quad (S7)$$

Putting the value of $V_{OC,rad}$ in equation (S4), the relation can be deduced as, $$V_{OC,rad} - V_{OC} = -\frac{kT}{q}\ln(EQE_{LED}(V_{OC})) \quad (S8)$$

Figure 13:
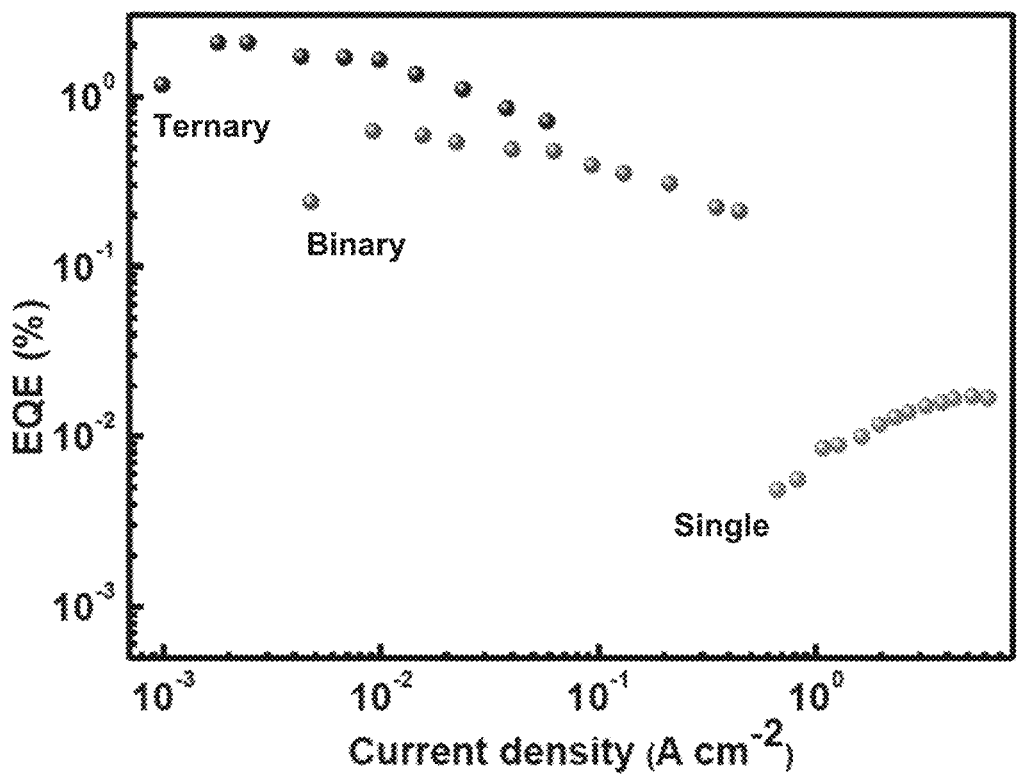
FIG. 13: Luminescent EQE of single, binary, ternary blend based PV devices.

The difference between the $V_{OC,rad}$ and $V_{OC}$ is caused by the non-radiative recombination loss in the device. FIG. 13 showed the $EQE_{LED}$ of the PV devices to calculate the radiative $V_{OC}$ limit using equation (S8).

FIG. 4C and Table 5 below summarize the radiative limit and non-radiative loss of the $V_{OC}$. Non-radiative losses decrease with binary blending compared to the single QDs and further decrease in ternary blend devices with ZnO loading. The EQE spectra of these solar cell devices (FIG. 4D) demonstrates their spectral reach down to 1400 nm, determined by the low-bandgap PbS QDs. Naturally the EQE in the infrared is reduced in the case of binary blend due to the low loading of the large PbS QDs in the blend and its consequent lower absorption. In the case of ternary a more drastic reduction in EQE across the spectrum can be observed, which is ascribed to the poor electron transport through the ZnO NC network [28,29].

TABLE 5

Radiative VOC derived from LED EQE of the PV devices

| PV devices | $V_{OC}$ (V) | $EQE_{LED}$ (at $V_{int} = V_{OC}$) | $\Delta V_{OC, non\text{-}rad}$ (V) | $V_{OC, rad}$ (V) |
|---|---|---|---|---|
| Single | 0.39 | 0.005% | 0.26 | 0.65 |
| Binary | 0.59 | 0.54% | 0.13 | 0.72 |
| Ternary | 0.69 | 1.8% | 0.10 | 0.79 |

Theoretically, Gong et al. have shown the influence of trap-state reduction on the enhancement of radiative recombination [21]. To further characterize and quantify the degree of trap-state passivation upon blending, thermal admittance spectroscopy (TAS) has been employed. TAS allows obtaining a quantitative picture of the in-gap trap distribution of the photoactive material as previously demonstrated on different types of PV devices [49,50]. The detailed analysis of the employed method is described below with reference to FIG. 14.

Figure 15A:
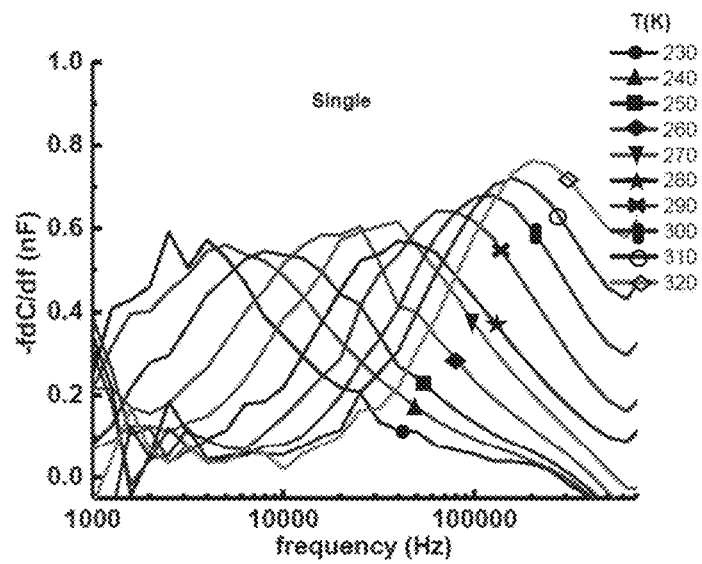
FIGS. 15A-15C: (−fdC/df) vs frequency plots to estimate the turn-over frequency (resonance frequency) for (FIG. 15A) single, (FIG. 15B) binary, and (FIG. 15C) ternary devices.
Figure 15B:
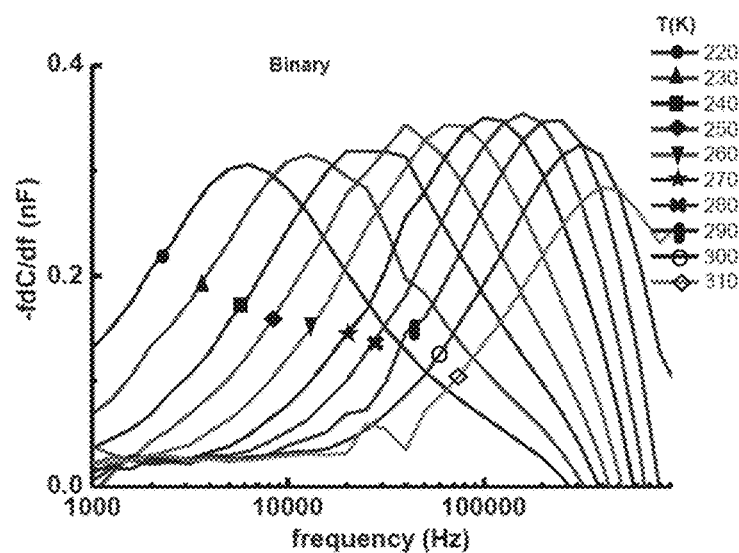
Figure 15C:
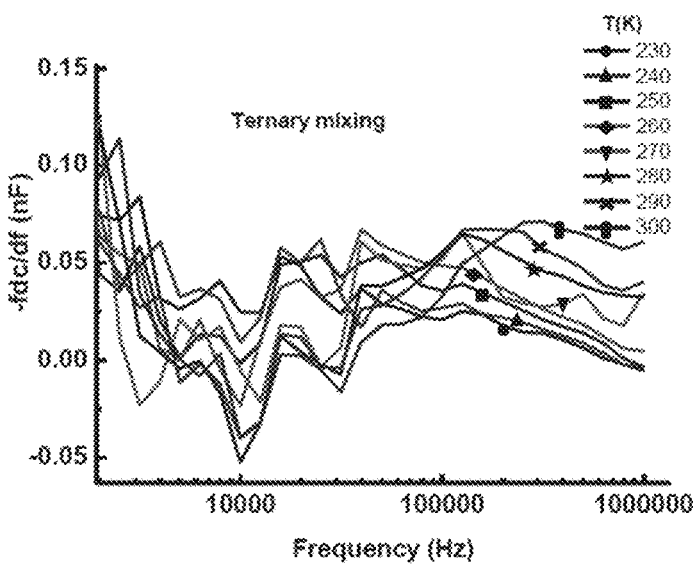

Thermal Admittance Spectroscopy (TAS) Analysis:

Several reports have been demonstrated over the years about the TAS procedure to analyse the in-gap traps in different types of PV [49,50,53]. The capacitance of the devices which is considered as the imaginary part of the admittance has been measured by the present inventors. The capacitance was scanned throughout the frequency region to find out the turn-over frequency (resonance frequency) for a particular temperature (FIGS. 14 and 15). Now, the turn-over frequency ($f_0$) at a particular temperature (T) can be correlated to the trap escape frequency ($\xi_0$) as, $$f_0 = 2\xi_0 T^2 \exp\left(\frac{-E_A}{k_b T}\right) \quad (S9)$$

Where $E_A$ is the trap activation energy and $k_b$ is the Boltzman's constant. Equation (S6) can estimates the value of $E_A$ (Arrhenius plot FIG. 16). The trap distribution ($N_t$) for a linear band heterojunction device can be written as [49], $$N_t(E_f) = \frac{-V_{bi}^2}{W_D[qV_{bi} - (E_{f\infty} - E_f)]}\frac{dC}{df}\frac{f}{k_b T} \quad (S10)$$

Where $V_{bi}$ and $W_D$ are the built-in potential and depletion width of the device which were calculated from standard Mott-Schottky analysis. $E_{f\infty}$ is the bulk fermi level (far from the junction) of the active material. $E_f$ can be written by modifying the equation (S9) as, $$E_f = k_b T \ln\left(\frac{2\xi_0 T^2}{f}\right) \quad (S11)$$

The C-f and (−fdC/df)-f plots are shown in FIGS. 14 and 15 respectively. The $N_t$ was plotted as a function of $E_f$ using equations S10 and S11. The total trap was estimated by the integration of $N_t$ throughout the energy spectra.

Estimation of Traps per QDs in Single, Binary and Ternary Systems:

The average diameter of the matrix QDs and emitter QDs are respectively 2.6 nm and 4.66 nm (estimated from excitonic absorption peak).

Matrix QD volume:

$$V1 \approx \frac{4\pi}{3}(1.3 \times 10^{-7})^3 \text{cm}^3.$$

Emitter QD Volume:

$$V2 \approx \frac{4\pi}{3}(2.33 \times 10^{-7})^3 \text{cm}^3.$$

Number of emitter QD per 1 cm³ volume $$(N2) \sim \frac{0.74}{V2} \sim 1.4 \times 10^{19} \text{cm}^{-3}.$$

Similarly, number of matrix QD per 1 cm³ will be, $N1 \sim 8.1 \times 10^{19}$.

Number of QDs in binary~$(0.925N1+0.075N2) \sim 7.5 \times 10^{19}$ cm$^{-3}$.

In case of ternary, we need to consider the ZnO nc diameter similar as the emitter quantum dots and the difference in density (5.6 gm/cm$^3$ for ZnO and 7.6 gm/cm$^3$ for PbS), the volume ratio of PbS to ZnO mixing ratio will be 0.44 to 0.56. So, the estimated particles in ternary blend will be, 4.1×10$^{19}$ cm$^{-3}$.

From TAS, the total trap density for single, binary, and ternary is obtained as 10$^{16}$ cm$^{-3}$, 4.85×10$^{15}$ cm$^{-3}$, and 6.5×10$^{14}$ cm$^{-3}$ respectively. So, the number of traps per QDs in single, binary, ternary will be 7.1×10$^{-4}$, 6.5×10$^{-5}$, and 1.6×10$^{-5}$ respectively.

Figure 16:
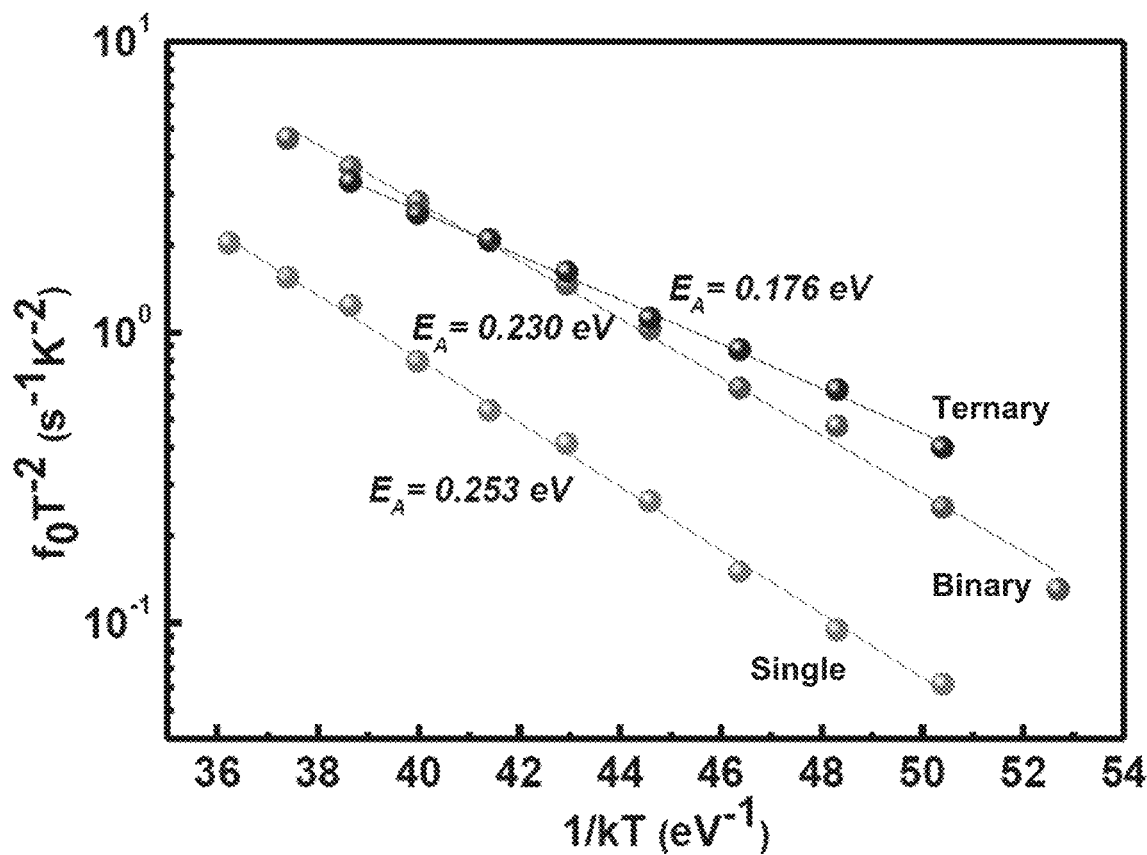
FIG. 16: The Arrhenius plot of $f_0 T^{-2}$ yields the activation energy (EA) from the temperature dependent c-f plot. The slope of the plot gives the activation energy of the single binary and ternary blend devices.

The trap distribution as a function of E$_t$ (position of trap state with respect to the band-edge) deduced from TAS analysis gives a clearer picture of trap reduction upon QD blending as shown in FIG. 4E. E$_t$ decreases from 0.254 eV for single QD based device to 0.237 eV for binary blending and further reduces to 0.174 eV for ternary blend. The position of E$_t$ follows similar trend like trap activation energy (E$_A$) as determined from Arrhenius plot (FIG. 16). The overall trap-state density decreased from 10$^{16}$ cm$^{-3}$ for single QDs based device to 4.85×10$^{15}$ cm$^{-3}$ for binary QDs and further down to 6.5×10$^{14}$ cm$^{-3}$ for ternary QDs based device. These results from TAS also corroborate the here presented hypothesis on the passivation mechanism at play upon binary and ternary blending. In the case of binary blending there is an overall effective reduction of trap states without much alteration of the energetic value of the traps, i.e. their nature; this is in accordance to the model described in FIG. 3E. Upon ternary blending, in addition to the reduction of the trap density, there is also a significant lowering of the trap-state depth due to the remote passivation facilitated by the ZnO NCs (FIG. 3F). It must be noted that TAS technique measures the overall trap state density of the blend and cannot distinguish between traps in the emitter QDs and the matrix QDs. However, in case of the ternary blend the resultant trap state density per emitter QD is one order of magnitude lower than that of single providing strong evidence of the trap state reduction upon the use of ZnO NCs (see "Estimation of traps per QDs in single, binary and ternary systems" above).

In order to thoroughly examine whether the trap state reduction is the sole responsible for this notable increase in V$_{OC}$, the present inventors performed SCAPS simulations of a single layer device in which the trap state density across the experimentally reached range of values was varied. According to SCAPS the expected V$_{OC}$ increase from single to binary to ternary devices is 40 mV and 100 mV respectively, whereas the observed increase in V$_{OC}$ from single to binary is around 200 mV. SCAPS simulations confirm that upon trap state reduction from single to binary V$_{OC}$ increases but to a lesser extent than what it has been experimentally measured by the present inventors, whereas the further increase in V$_{OC}$ from binary to ternary is accounted for trap state reduction. The present inventors therefore sought additional mechanisms at play in the binary blends that may contribute to this high value of V$_{OC}$. The binary blend devices comprise ~7.5% lower bandgap emitter QDs embedded in a larger bandgap matrix QDs. Therefore, the density of states (DOS) of the low bandgap QDs in a binary device is reduced over the DOS of the single layer counterpart. A more detailed model which takes into account the effective reduction of the DOS of the binary blend presented below.

Explanation of Change of V$_{OC}$ with Binary and Ternary Blends Compared to the Emitter Only Device:

To investigate the effect of density of states (DOS) in QD blend devices, the present inventors have performed the intensity dependent V$_{OC}$ variation of all three different devices with two different wavelengths of 637 nm and 1310 nm, where 637 nm can excite both the QDs (emitter QD as well as matrix) in blend and 1310 nm laser can only excite the emitter QDs. The effect of different excitation source on V$_{OC}$ is shown in FIG. 4f. Two different scenarios for V$_{OC}$ change are considered, namely the effect of trap reduction and the effect of reduced DOS in the blend devices. Considering the TAS data there is a significant reduction of trap state density from single to binary devices (more than two fold). Some SCAPS simulations have been performed to investigate the effect of trap state reduction on the V$_{OC}$ performance as shown in Table 6. It shows the trap reduction facilitates the V$_{OC}$ improvement of the device irrespective of the change of mobility. But the trap state reduction alone cannot explain the change of V$_{OC}$ from single to binary as the degree of V$_{OC}$ change more than expected V$_{OC}$ change with the above mentioned trap reduction. The present inventors therefore investigated the scenario that the reduction of DOS of the low bandgap material plays a role in this effect. It has been considered case by case using two different excitation wavelengths, one exciting only the emitter (low bandgap) QDs and the other exciting both.

TABLE 6

SCAPS simulated V$_{OC}$ (V) of the single PV device with the variation of mobility and trap density

| Trap density | Mobility (cm$^2$V$^{-1}$s$^{-1}$) | | | |
| --- | --- | --- | --- | --- |
| (cm$^{-3}$) | 1E-2 | 1E-3 | 1E-4 | 1E-5 |
| 5E16 | 0.40 | 0.38 | 0.38 | 0.4 |
| 1E16 | 0.48 | 0.47 | 0.46 | 0.46 |
| 5E15 | 0.51 | 0.50 | 0.49 | — |
| 1E15 | 0.56 | 0.56 | 0.56 | 0.57 |
| 5E14 | 0.57 | 0.58 | 0.58 | 0.59 |

Figure 23A:
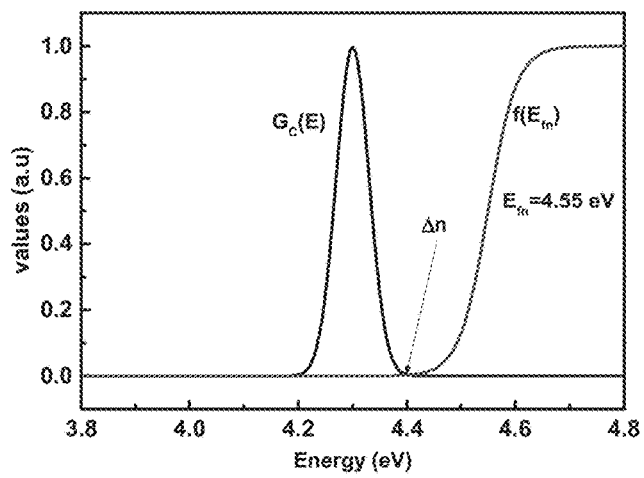
FIGS. 23A-23D: Schematic of conduction band overlap with Fermi function for photogenerated electrons for single (FIG. 23A) and binary blends (FIG. 23C). Corresponding quasi-Fermi level changes for (FIG. 23A) single and (FIG. 23C) binary blends with 1300 nm excitation are presented in FIGS. 23B and 23D, respectively.
Figure 23B:
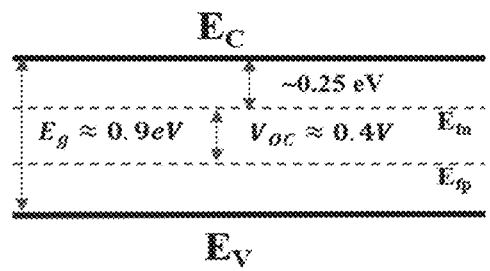
Figure 23C:
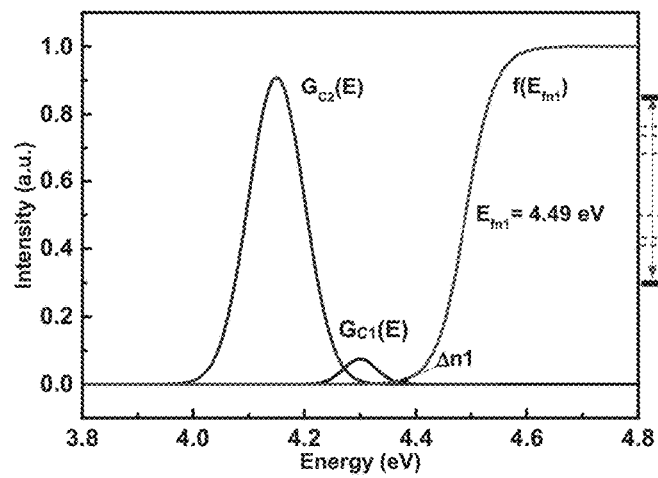
Figure 23D:
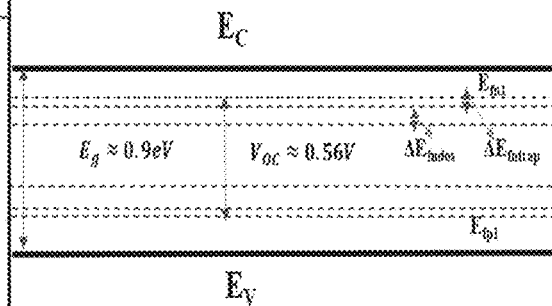

(i) Explanation for the Change of V$_{OC}$ from Single to Binary with 1310 nm Excitation:

V$_{OC}$ of a PV device depends on the splitting of electron and hole quasi Fermi levels created due to the effect of photo-generated carriers. The photo-generated electron density can be expressed as [57], $$\Delta n = \int_{E_C}^{\infty} f(E_{fn}) G_C(E) dE \quad (S12)$$

Where f(E$_{fn}$) is the Fermi function at the quasi Fermi level and G$_C$(E) is the density of states distribution in the conduction band. The schematic of photo-generated carriers for single QD based device is shown in FIG. 23A. The corresponding quasi Fermi levels are shown in FIG. 23B. In case of binary blend, the overall nature of the conduction band density of states will be modified as shown in FIG. 23(c) due to the reduction of emitter QD density of states (G$_{C1}$(E) is 7.5% of G$_C$(E)) and the presence of matrix QDs (G$_{C2}$(E)). For the spread of the DOS Gaussian function the distribution from the absorption of the dots akin to the size distribution of the ensemble has been taken. The difference between the conduction band offset is around 0.15 eV. The photogenerated carriers in the mixed system upon 1300 nm (only emitter) excitation can be given as, $$\Delta n1 = \int_{E_C}^{\infty} f(E_{fn1}) G_{C1}(E) dE \quad (S13)$$

Where f(Efn1) is the modified Fermi function due to change of quasi Fermi level. To achieve Δn1=Δn (considering the similar excitation intensity), the quasi-Fermi level needs to change (ΔE$_{fndos}$) ~0.06 eV. Similar treatment of the model for holes also yields 0.06 eV change assuming symmetric confinement of the bands. According to the SCAPS simulation (Table 6), a 2 fold reduction of trap density yields a $V_{OC}$ improvement of ~40 mV. The total improvement in the quasi-Fermi level change from single to binary for 1300 nm excitation will be around 0.15-0.16 V matching well with the obtained experimental values.

Figure 24A:
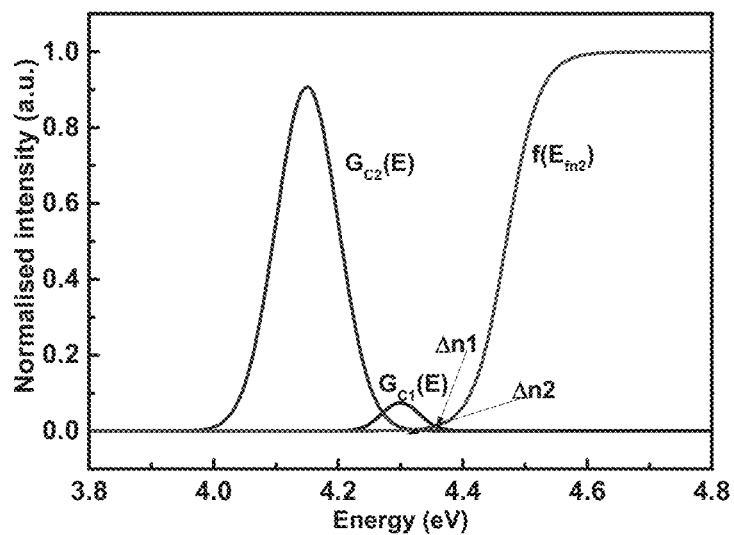
FIGS. 24A and 24B.
Figure 24B:
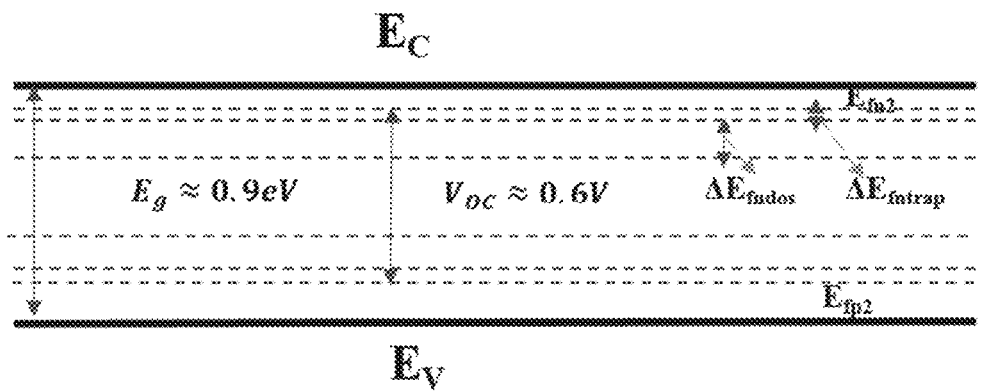
Figure 27A:
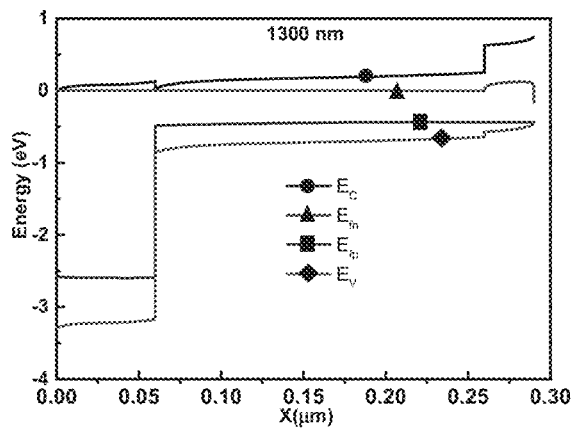
FIGS. 27A-27F: SCAPS simulated quasi Fermi level at VOC condition with different illuminations for single (FIGS. 27A-27C) and binary (FIGS. 27D-27F) devices.
Figure 27D:
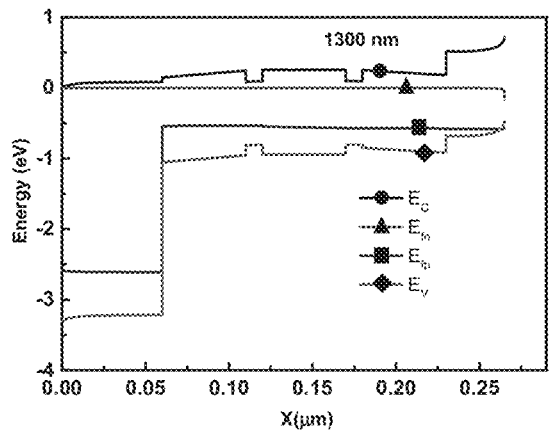
Figure 27B:
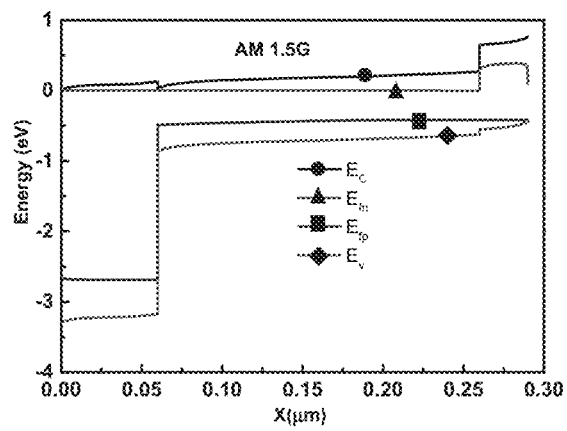
Figure 27E:
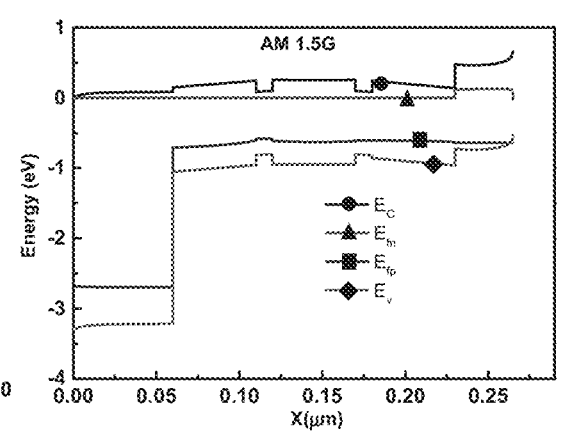
Figure 27C:
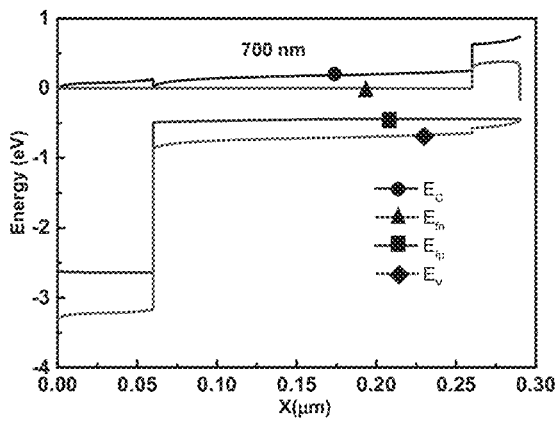
Figure 27F:
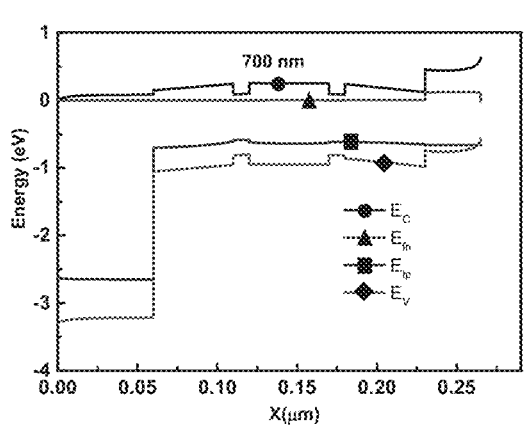

(ii) Explanation for the Change of $V_{OC}$ from Single to Binary with 637 nm Excitation:

With 637 nm excitation both emitter as well as matrix QDs will contribute to the photo-generated charge carriers (Δn2) and the increase of photo-generated charge carriers will further modify the quasi Fermi level as shown in FIG. 24. In this case, the quasi-Fermi level modification due to trap state reduction will be similar as in the binary upon 1300 nm excitation case (~40 meV), but the main modification will come from the additional contribution of photo-generated carriers in the QD matrix which results in an additional increase of 40 meV in the electron quasi-Fermi level.

To visualise this effect, the present inventors have run some SCAPS simulations to calculate the change of quasi-Fermi levels in case of binary blends. For binary devices, several heterojunctions between the matrix and emitter QDs have been considered, as shown in FIG. 25 (the ratio of the emitter to matrix was fixed at 7.5%). The simulation shows there is an increase in $V_{OC}$ from single to binary for both 1300 nm and 700 nm excitation as shown in FIG. 26. The simulation is also in agreement with the experimental results in that the $V_{OC}$ of the single PV device does not change for excitations of the same intensity and different wavelengths, in contrast to the binary devices in which the $V_{OC}$ depends on the excitation wavelength for the same optical intensity. The latter is also consistent with the effect of the DOS in the $V_{OC}$ of the cells as elaborated above. In FIG. 27 the energy band diagrams of the two devices at open circuit condition for the excitation conditions tested in FIG. 26 are plot.

Figure 28:
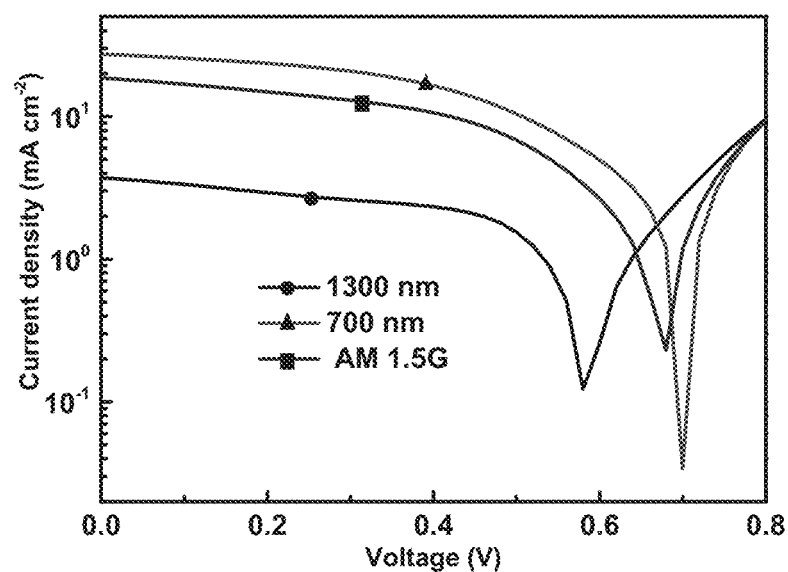
FIG. 28: SCAPS simulation on the binary devices with reduced trap states mimicking the trap state density of the ternary blend device.

(iii) $V_{OC}$ Changes from the Binary to Ternary Devices:

The present inventors believe that the $V_{OC}$ changes from binary to ternary device take place due to remote trap passivation stemming from ZnO in agreement with the TAS measurements. TAS measurements show that there is an order of magnitude reduction in trap state density compared to the binary films. The intensity dependent $V_{OC}$ plot also supports the present inventors' claim as changes from binary to ternary are equal in both the cases of 637 nm and 1310 nm excitation. The present inventors have also performed SCAPS simulation on the above mentioned binary structure (FIG. 25B) by reducing the trap state density one order of magnitude. The results shown in FIG. 28 corroborate the observed increase in $V_{OC}$.

TABLE 7

SCAPS simulation parameters [58]

| Parameters | ZnO | Emitter PbS QD layer | Matrix PbS QD layer | EDT treated PbS blocking layer |
|---|---|---|---|---|
| Bandgap (eV) | 3.4 | 0.9 | 1.2 | 1.2 |
| Electron affinity (eV) | 4.2 | 4.3 | 4.15 | 3.8 |
| Relative dielectric constant | 66 | 22 | 22 | 18 |
| CB effective density of states (cm$^{-3}$) | 1E+19 | 1E+19 | 1E+19 | 1E+19 |

TABLE 7-continued

SCAPS simulation parameters [58]

| Parameters | ZnO | Emitter PbS QD layer | Matrix PbS QD layer | EDT treated PbS blocking layer |
|---|---|---|---|---|
| VB effective density of states (cm$^{-3}$) | 1E+19 | 1E+19 | 1E+19 | 1E+19 |
| Electron thermal velocity (cm s$^{-1}$) | 1E+7 | 7E+3 | 7E+3 | 7E+3 |
| Hole thermal velocity (cm s$^{-1}$) | 1E+7 | 7E+3 | 7E+3 | 7E+3 |
| Electron mobility (cm$^2$V$^{-1}$s$^{-1}$) | 5E-3 | Variable | Variable | 1E-2 |
| Hole mobility (cm$^2$V$^{-1}$s$^{-1}$) | 5E-3 | Variable | Variable | 1E-2 |
| Donor density (cm$^{-3}$) | 1E+18 | 1E+16 | 1+E16 | 0 |
| Acceptor density (cm$^{-3}$) | 0 | 0 | 0 | 1E+16 |
| Trap density (cm$^{-3}$) | — | 5E+16 | 5E+16 | 5E+16 |
| Trap depth relative to $E_C$ (eV) | — | 0.3 | 0.3 | 0.3 |
| Trap capture cross-section (cm$^2$) | — | 1.2E-13 | 1.2E-13 | 1.2E-13 |

The above mentioned reduction of the DOS yields an improvement in $V_{OC}$~120 mV when only the emitter QDs are excited and ~160 mV upon excitation of both the matrix and emitter QDs. To further corroborate this hypothesis, the intensity and wavelength dependence of the $V_{OC}$ for the three classes of devices is plotted in FIG. 4F. In agreement with SCAPS modelling (FIG. 26), the $V_{OC}$ of the single device is independent of the photon energy for the same intensity whereas in the case of blend devices lower energy photons of 1310 nm (that excite only the low bandgap QDs) yield lower $V_{OC}$ than higher energy photons of 637 nm (that excite both the low bandgap and matrix QDs). These measurements support the here proposed hypothesis of combined effect of trap state reduction and DOS modification on the $V_{OC}$ improvement with blend structures compared to the emitter only devices.

In addition to the effect of the DOS reduction on the observed Voc the reduced DOS of the emitter QDs in the blends (binary or ternary) is also responsible for the observation of the turn-on voltage of the LED at a bias lower than the bandgap of the emitting semiconductor. Experimentally it is observed a Von threshold of 0.6V for emission of photons with energy of 0.9 eV that happens for a DOS reduction in the nanocomposite to 7.5%. The turn-on voltage of the LED is expected to decrease even further at lower DOS i.e. lower loading of emitter QDs in the blend to the level of 1% and progressively increases with increasing loading concentration of the emitter QDs. The reason for this effect is that the quasi Fermi levels of electrons and holes expand and approach the conduction band and valence band of the emitter QDs at voltages below the bandgap due to their reduced density of states in the nanocomposite giving rise to the observed effect.

Table 8 below shows that the electron quasi Fermi level approaches the conduction band of the emitter QDs in the binary device faster (i.e. at lower applied bias) than in the single device, increasing the probability of electron occupation in the conduction band and thereby facilitating light emission even at electrical bias below the bandgap of the emitter (the same picture by symmetry applies also in the valence band of the emitter QDs with the hole quasi Fermi level).

TABLE 8

Comparison of electron quasi Fermi level splitting for the control (single) and binary devices with 7.5% loading of emitter QDs as a function of electrical applied bias

| Bias voltage (V) | $E_c - E_{fn}$ (eV) (control) | $E_c - E_{fn}$ (eV) (binary) |
|---|---|---|
| 0.5 | 0.119 | 0.062 |
| 0.6 | 0.105 | 0.055 |
| 0.7 | 0.0101 | 0.043 |
| 0.8 | 0.01 | 0.04 |
| 0.9 | 0.095 | 0.039 |

In summary, by means of the present invention the present inventors have reported on a new approach of engineering quantum dot solids at the supra-nanocrystalline level that has led to record low trap state density, very high PLQE values in solid-state conductive QD films and thereby highly efficient LEDs. The use of different bandgap QDs also offers a leverage to tune the density of states in quantum confined nanocomposite solids that has allowed to reach very high open circuit voltage when these devices have been operated as solar cells. The present invention offers new insights in engineering the energetic potential landscape of QD solids with important implications towards higher performance light emitters and solar cells.

Methods

Synthesis of PbS QDs:

Schlenk technique was used to synthesize PbS QDs. 830 nm and 940 nm excitonic peak based PbS QDs were synthesized following the standard recipe. 2 mmol lead oxide (PbO), 4.7 mmol oleic acid, and 9.4 mmol 1-octadecene (ODE) were pumped overnight at 95° C. Then 15 mL of ODE was added and the temperature of the reaction was adjusted to 75° C. or 100° C. for 830 nm and 940 nm PbS QDs, respectively. When the temperature point is reached, 1 mmol hexamethyldisilane (TMS) mixed with 10 mL ODE was immediately injected. The heating was stopped (without removing the heating mantle) and the sample allowed to cool down gradually (~1 hour). The NCs were isolated by adding acetone and then centrifuged, purified by dispersion/precipitation with toluene/acetone 3 times, and finally dispersed in anhydrous toluene (30 mg mL$^{-1}$) before using them for device formation.

1300 nm excitonic peak based PbS QDs were synthesized by a previously reported multi-injection method with modifications [51]. Typically, PbO (0.45 g), oleic acid (3.8 mL) and ODE (50 mL) were mixed together at 95° C. under vacuum for 12 hours. Then the temperature of the reaction was raised to 100° C. The solution of 90 μL TMS in 3 mL ODE was injected, the additional 3 injections (25 μL TMS in 3 mL ODE for each injection) were sequentially followed by a fixed time. When the injection was finished, the heating was stopped immediately and the sample was allowed to cool down gradually to room temperature under constant stirring. QDs were precipitated by adding acetone, followed by centrifugation, purified in air by using toluene/acetone as solvent/anti-solvent. The final QDs were dispersed in toluene with a concentration of 30 mg mL$^{-1}$ for device fabrication.

ZnO Nanocrystals Preparation:

ZnO nanocrystals were prepared following a previously reported method [28]. 2.95 g zinc acetate dihydrate was dissolved in 125 mL methanol under vigorous stirring and the temperature of the solution was set at 60° C. At the same time, in a separate vial 1.48 g KOH (90%) was dissolved in 65 mL methanol solution. The prepared KOH solution was then added dropwise to the zinc acetate solution for a period of 4 minutes while the temperature was kept at 60° C. with constant stirring. The reaction conditions were left unaltered for the next 2.5 hours. After completion of the reaction, the heating source was removed and the solution was allowed to cool down slowly to room temperature. The solution was then centrifuged at 3500 rpm for 5 minutes. The supernatant was discarded and an equal amount of methanol was added and centrifugation repeated. After three rounds of purification, the NCs were dispersed in a solution of 2% butylamine in chloroform for base layer formation and in 5% butylamine in toluene for ternary blend formation.

LED Device Preparation:

LEDs were prepared on cleaned ITO coated glass. The electron transporting layer (ZnO) was prepared by spin coating ZnO nanocrystals in chloroform (40 mg mL$^{-1}$) with a spin speed of 4000 rpm. The procedure was repeated once more to have a thicker film of approximately 80 nm. The active emitting layer was grown on top of the ZnO layer. Before mixing, all QDs and ZnO NC solutions were prepared in separate vials with the same concentration (30 mg ml$^{-1}$). For binary blends, emitter PbS QDs were mixed to donor PbS QDs with different volume ratios. Ternary blends were formed by mixing ZnO NC solution to the binary blend with different volume ratios. During the film formation, QDs were treated with ZnI$_2$ and MPA mixed ligand as described in a previous report [33] of the present inventors. The mix ligand was prepared by mixing 25 mM ZnI$_2$ in methanol and 0.015% MPA in methanol solutions. The ZnO substrates were covered with 50 μL of QD solutions and spun immediately with 2500 rpm for 15 seconds. Then, the spin coater was stopped to add few drops of mixed ligand to treat for 5 seconds. After that, the spincoater was started to dry the film which was then washed with few drops of methanol. The procedure was repeated thrice to get an average thickness of 60 nm. The hole transporting layer was formed by using small diameter PbS QDs treated with 0.02% EDT in acetonitrile solution. The back electrode was formed with Au deposition through a pre-patterned shadow mask in thermal evaporator (Nano 36 Kurt J. Lesker) at a base pressure of 10$^{-6}$ mbar. The active area for each device is 3.14 mm$^2$.

LED Performance Characterization:

All the devices were fabricated and characterized in ambient air conditions. Current density-voltage (J-V) characteristics were recorded using a computer-controlled Keithley 2400 source measurement unit. To calculate the EQEs, electroluminescence from the front face of the device was detected using a calibrated Newport 918D-IR-OD3 germanium photodetector connected to Newport 1918-C power meter in parallel to the J-V measurements. A Shadow mask of 3 mm in diameter was placed in front of the device to minimize the waveguide effect from ITO coated glass. Lambertian emission was assumed. The thickness of the glass substrate was considered during the solid angle measurement. The radiance was further verified with a NIST certified 818-IG InGaAs photodetector with calibrated DB15 module by Newport.

PL and PLQE Measurements:

PL measurements were performed using a Horiba Jobin Yvon iHR550 Fluorolog system coupled with a Hamamatsu RS5509-73 liquid-nitrogen cooled photomultiplier tube, and a calibrated Spectralon™ coated Quanta-phi integrating sphere. All reported steady-state PL spectra and photoluminescence quantum efficiency (PLQE) measurements were collected using a continuous-wave Vortran Stradus 637 laser diode as excitation source ($\lambda$=637 nm, maximum power=80 mW), and all reported steady-state PL spectra have been corrected for the system response function. Both binary and ternary blend films used in the PL measurements were prepared via aforementioned layer-by-layer deposition using the mixed-ligand-exchange procedure (5 layers) onto (3-mercaptopropyl) trimethoxysilane (MPTS) functionalized glass. Such treatment was used to improve the adhesion of the QDs on glass to obtain continuous and uniform QD films. The treatment was performed prior QDs deposition by inserting 1×1 cm glass substrates into a petri dish containing a MPTS toluene solution (10% by volume) then removed after 24 hours and gently dried under a flux of nitrogen.

The PLQE measurements were carried out as following: initially, the PLQE of a 100 nm thick film of PbS QDs (reference film) was measured inside the calibrated integrating sphere using the procedure proposed by De Mello et al. [52] ($\lambda_{PL}$=1100 nm, film was fabricated following the method described above) yielding a PLQE of 24±3%. The emission intensity of the film was then measured in the sample chamber of the fluorimeter (i.e. outside the integrating sphere) using predetermined and fixed excitation and collection conditions. By comparing the emission intensity measured outside and inside the integrating sphere, and the optical absorption at the excitation wavelength obtained inside the integrating sphere, we obtained a correction factor (i.e. the PLQE of the reference film calculated using the number of emitted photons measured in the fluorimeter sample chamber and the number of absorbed photons measured in the integrating sphere was 48 times higher than the real value). Afterward, all other films were measured using the same procedure (number of absorbed photons measured inside the sphere, number of emitted photons measured in the fluorimeter sample chamber) using the predetermined and fixed excitation and collection conditions employed for the reference film, and the correction factor was applied to obtain the PLQE value.

The above method was employed for all the PLQE values reported in the manuscript as it was not possible to use the Quanta-phi integrating sphere for $\lambda_{PL}$>1200 nm as the fiber bundles interfacing the Quanta-phi integrating sphere to the Horiba Jobin Yvon iHR550 Fluorolog system are not transparent in this spectral range. The obtained correction factor from the reference film accounts for the response function of the whole fluorimeter and detector. Yet, considering the different emission wavelength of the reference film ($\lambda_{PL}$=1100 nm) and the blended films ($\lambda_{PL}$=1371 nm), a deviation of the correction factor value can arise from the different spectral reflectivity of the sphere although SPECTRALON™ presents small reflectance variation in this spectral region (less than 1%). The PL decay measurements were performed using Horiba spectraLED—S-625 excitation source ($\lambda$=637 nm) with time resolution of 300 ns.

Figure 29A:
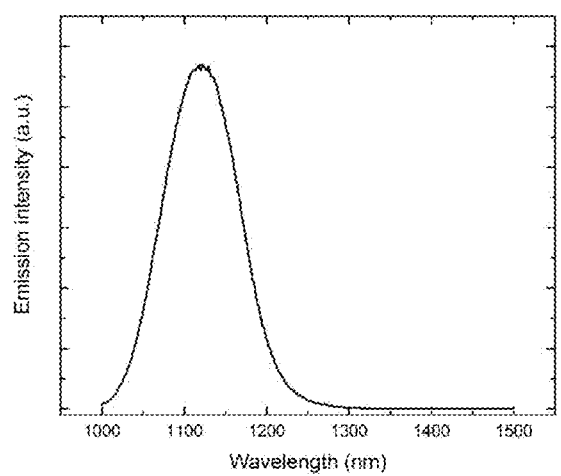
FIGS. 29A and 29B.
Figure 29B:
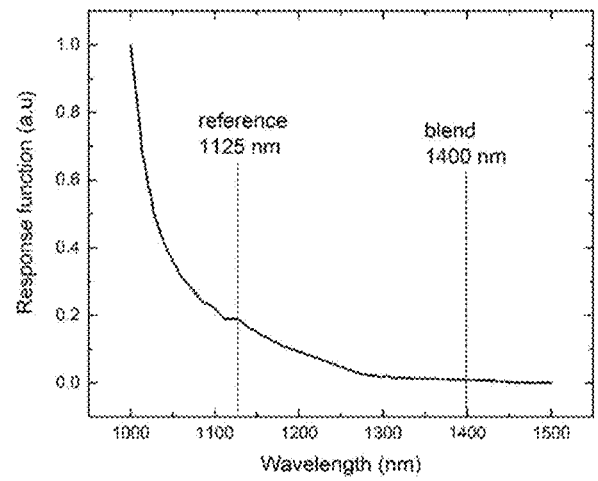

For the PLQE measurements the reference sample has been used to compensate the lack of transparency of the optical interface (i.e. optical fibre bundle) between the Spectrofluorometer and the integrating sphere for wavelengths>1250 nm. The emission wavelength of the reference sample based PbS QDs with similar ligand treatment<1250 nm has been chosen. The Emission spectra and the instrument response function is shown in FIG. 29.

EL Measurements:

Spectral EL measurements were also performed using a Horiba Jobin Yvon iHR550 Fluorolog system coupled with a Hamamatsu RS5509-73 liquid-nitrogen cooled photomultiplier tube. The voltage bias to the device was applied with a Keithley 2400 source measurement unit. The acquired spectra were corrected using the system response factor provided by the manufacturer.

Photovoltaic Device Preparation and Characterizations:

The PV device preparation follows a similar procedure as the LED described above other than the thickness of the respective layers. The ZnO base layer was deposited thinner compared to LED device (~40 nm). The active layer was prepared much thicker in order to absorb sufficient photons (~200-220 nm). Finally, 2 layers of EDT treated PbS (~30-35 nm) were used as electron blocking layer. Approximately 100 nm Au was deposited as the back electrode. The active area of the device was 3.14 mm$^2$. All the PV characterizations were performed in ambient conditions. The device I-V responses were collected using a Keithley 2400 source meter. Illumination intensity of AM 1.5 was maintained using a class AAA solar simulator (Oriel sol3A, Newport Corporation). The accuracy of the measurement was determined as ±4%. EQE measurements were performed with an in-house built experimental set-up by using chopped (220 Hz, Thorlab) monochromatic illumination. The power was measured with a calibrated Newport-UV power meter. The device response of the chopped signal was measured using a Stanford Research system lock-in amplifier (SR830) which was fed by a Stanford Research system low noise current pre-amplifier (SR570). The final EQE spectra were obtained with the help of LabVIEW program. The intensity dependent $V_{OC}$ measurements were performed with Vortran (637 nm) and Superk Extreme (NKT photonics, 1310 nm) lasers.

Thermal Admittance Spectroscopy (TAS) Measurements:

The measurements were performed with the PV devices in a Lakeshore four probe cryogenic chamber controlled by a Lakeshore-360 temperature controller. The frequency dependent capacitance was measured with an Agilent B1500 connected with an external capacitance measurement unit. The temperature was varied from 220 K to 320 K to acquire the frequency dependent capacitance variation. The voltage dependent capacitance was measured with the same instrument in order to obtain the value of depletion width and built-in voltage. The detailed data analysis procedure has been described above with reference to FIG. 14.

TEM Measurements:

The bright field (BF) TEM images of the films have been obtained with JEOL JEM-2100 (LaB$_6$ electron gun) transmission electron microscope, operating at 200 kV. The samples were prepared by spin coating the QD solutions onto 300-mesh carbon-coated copper grid at 2500 rpm. Then, the ligand exchange with ZnI$_2$_MPA was performed in line with the aforementioned device fabrication procedure.

Figure 17A:
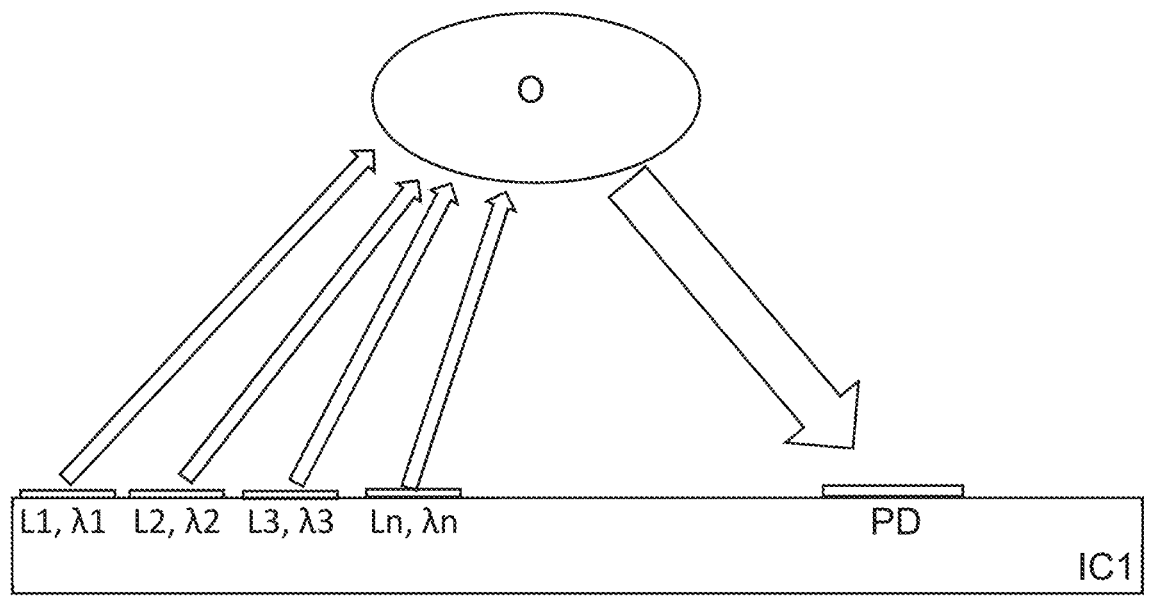
FIGS. 17A-17C schematically show three respective embodiments of the spectrometer of the present invention and associated operations thereof.
Figure 17B:
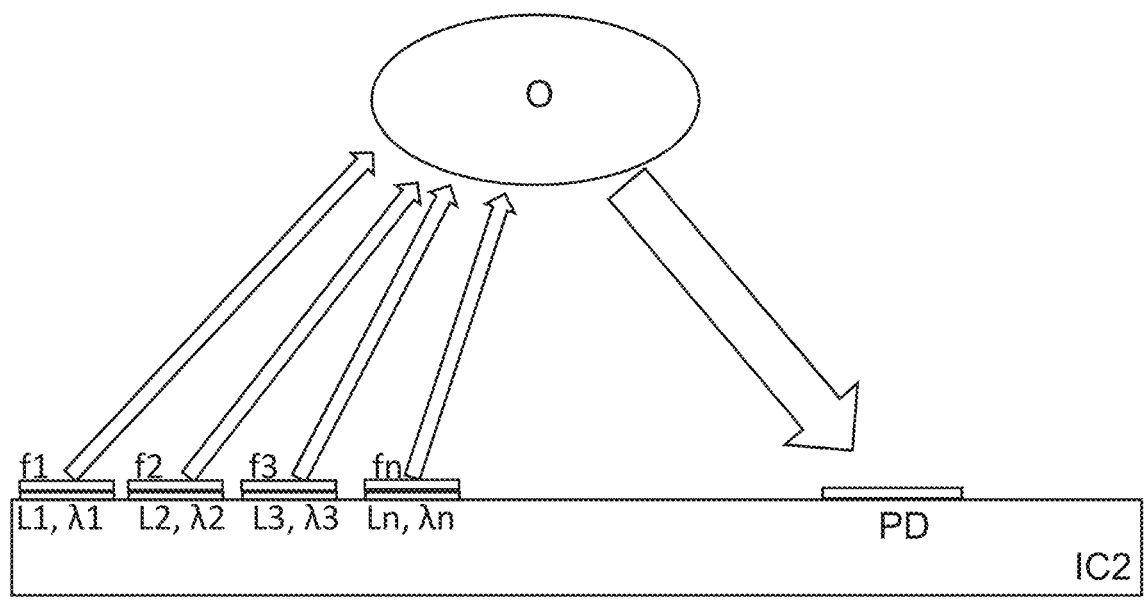
Figure 17C:
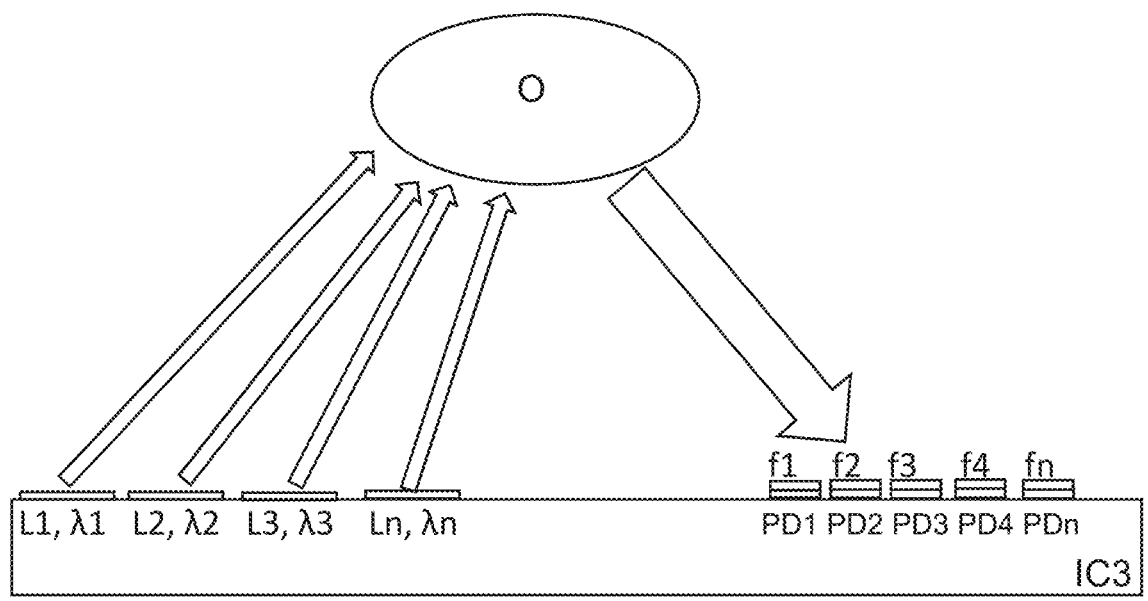

Finally, three respective embodiments for the spectrometer of the present invention and associated operations are shown in FIGS. 17A, 17B, and 17C.

Specifically, for the embodiment of FIG. 17A the spectrometer comprises multiple LEDs, L1, L2, L3 . . . Ln, each emitting light with a different wavelength, $\lambda 1, \lambda 2, \lambda 3 \ldots \lambda n$, towards an object O under test, and a photodetector PD configured and arranged to receive the light emitted by the LEDs once reflected (or transmitted) by the object O. For this embodiment, LEDs L1, L2, L3 . . . Ln are excited sequentially and so is the photo-detection and readout performed by the photodetector PD for each wavelength $\lambda 1, \lambda 2,$ λ3 . . . λn. In this case, the LEDs L1, L2, L3 . . . Ln and photodetector PD are embedded in a CMOS read-out chip IC1.

The embodiment of FIG. 17B is an improvement to that of FIG. 17A and differs therefrom ion that the spectrometer further comprises corresponding bandpass filters, f1, f2, f3 . . . fn, in front of the LEDs L1, L2, L3 . . . Ln, for spectral enhancement, A CMOS read-out chip IC2 embedding the LEDs L1, L2, L3 . . . Ln and photodetector PD is provided.

A different embodiment is shown in FIG. 17C, where a simultaneous excitation of all the LEDs, L1, L2, L3 . . . Ln, comprised by the spectrometer (having different wavelengths λ1, λ2, λ3 . . . λn) is performed, and also a simultaneous photo-detection and readout is carried out by means of a photodetector array including multiple photodetectors, PD1 to PDn, with respective bandpass filters f1, f2, f3, f4 . . . fn, each with a different bandpass range (e.g. f1: 1300-1350 nm, f2: 1350-1400 nm, f3: 1400-1450 nm, etc.), so that each photodetector detects light within the wavelength range of the associated bandpass filter. In this case, a chip IC3 embeds the LEDs, the photodetector array and also electric bias, synchronization and read-out electronics.

A person skilled in the art could introduce changes and modifications in the embodiments described without departing from the scope of the invention as it is defined in the attached claims.

REFERENCES

Throughout the instant disclosure, numbers presented in brackets refer to the references listed below. Additionally, all references listed below, as well as all references cited in the instant disclosure, including but not limited to all patents, patent applications and publications thereof, scientific journal articles, and database entries (including all annotations available therein) are incorporated herein by reference in their entireties to the extent that they supplement, explain, provide a background for, or teach methodology, techniques, and/or compositions employed herein.

[1] Konstantatos G. et al. Ultrasensitive solution-cast quantum dot photodetectors. *Nature* 442, 180-183 (2006).
[2] Sargent, Colloidal quantum dot solar cells. *Nat. Photonics* 6, 133-135 (2012).
[3] Liu et al. Hybrid organic-inorganic inks flatten the energy landscape in colloidal quantum dot solids. *Nat. Mater.* 16, 258-263 (2017).
[4] Anikeeva et al. Quantum dot light-emitting devices with electroluminescence tunable over the entire visible spectrum. *Nano Lett.* 9, 2532-2536 (2009).
[5] Shirasaki et al. Emergence of colloidal quantum-dot light-emitting technologies. *Nat. Photonics* 7, 13-23 (2013).
[6] Pal et al. 'Giant' CdSe/CdS core/shell nanocrystal quantum dots as efficient electroluminescent materials: strong influence of shell thickness on light-emitting diode performance. *Nano Lett.* 12, 331-336 (2012).
[7] Hines & Scholes. Colloidal PbS nanocrystals with size-tunable near-infrared emission: observation of post-synthesis self-narrowing of the particle size distribution. *Adv. Mater.* 15, 1844-1849 (2003).
[8] Mashford et al. High-efficiency quantum-dot light-emitting devices with enhanced charge injection. *Nat. Photonics* 7, 407-412 (2013).
[9] Dai et al. Solution-processed, high-performance light-emitting diodes based on quantum dots. *Nature* 515, 96-99 (2014).
[10] Supran et al. High-performance shortwave-infrared light-emitting devices using core-shell (PbS-CdS) colloidal quantum dots. *Adv. Mater.* 27, 1437-1442 (2015).
[11] Borek et al. Highly efficient, near-infrared electro phosphorescence from a Pt-metalloporphyrin complex. *Angew. Chem.* 46, 1109-1112 (2007).
[12] Goossens et al. Broadband image sensor array based on graphene-CMOS integration. *Nat. Photonics* 11, 366-371 (2017).
[13] Murphy. Optical sensing with quantum dots. *Anal. Chem.* 74, 520A-526A (2002).
[14] Medintz et al. Quantum dot bio conjugates for imaging, labelling and sensing. *Nat. Mater.* 4, 435-446 (2005).
[15] Voura et al. Tracking early metastatic progression with quantum dots and emission scanning microscopy. *Nat. Med.* 10, 993-998 (2004).
[16] Park et al. Soft, stretchable, fully implantable miniaturized optoelectronic systems for wireless optogenetics. *Nat. Biotechnol.* 33, 1280-1286 (2015).
[17] Kim et al. Battery-free, stretchable optoelectronic systems for wireless optical characterization of the skin. *Sci. Adv.* 2, e1600418 (2016).
[18] Lopez et al. A review of the application of near-infrared spectroscopy for the analysis of potatoes. *J. Agric. Food Chem.* 61, 5413-5424 (2013).
[19] Sun et al. Bright infrared quantum-dot light-emitting diodes through inter-dot spacing control. *Nat. Nanotechnol.* 7, 369-373 (2012).
[20] Yang et al. All-quantum-dot infrared light-emitting diodes. *ACS Nano* 9, 12327-12333 (2015).
[21] Gong et al. Highly efficient quantum dot near-infrared light-emitting diodes. *Nat. Photonics* 10, 253-257 (2016).
[22] Bourdakos et al. Highly efficient near-infrared hybrid organic-inorganic nanocrystal electroluminescence device. *Appl. Phys. Lett.* 92, 153311 (2008).
[23] Yang et al. Iodide capped PbS/CdS core-shell quantum dots for efficient long wavelength near-infrared light emitting diodes. *Sci. Reports* 7, 14741 (2017).
[24] Colvin et al. Light-emitting diodes made from cadmium selenide nanocrystals and a semiconducting polymer. *Nature* 370, 354-357 (1994).
[25] Tessler et al. Efficient near-infrared polymer nanocrystal light-emitting diodes. *Science* 295, 1506-1508 (2002).
[26] Konstantatos et al. Efficient infrared electroluminescent devices using solution-processed colloidal quantum dots. *Adv. Func. Mater.* 15, 1865-1869 (2005).
[27] Choudhury et al. Efficient solution-processed hybrid polymer-nanocrystal near infrared light-emitting devices. *Org. Electron.* 11, 23-28 (2010).
[28] Rath et al. Remote trap passivation in colloidal quantum dot bulk nano-heterojunctions and its effect in solution-processed solar cells. *Adv. Mater.* 26, 4741-4747 (2014).
[29] Pradhan et al. Breaking the open-circuit voltage deficit floor in pbs quantum dot solar cells through synergistic ligand and architecture engineering. *ACS Energy Lett.* 2, 1444-1449 (2017).
[30] Carey et al. Record charge carrier diffusion length in colloidal quantum dot solids via mutual dot-to-dot surface passivation. *Adv. Mater.* 27, 3325-3330 (2015).
[31] Zhitomirsky et al. Engineering colloidal quantum dot solids within and beyond the mobility-invariant regime. *Nat. Commun.* 5, 3803 (2014).
[32] Bi et al. Infrared solution-processed quantum dot solar cells reaching external quantum efficiency of 80% at 1.35 µm and $J_{SC}$ in excess of 34 mA cm$^{-2}$. *Adv. Mater.* 30, 1704928 (2018).

[33] Pradhan et al. Trap-state suppression and improved charge transport in pbs quantum dot solar cells with synergistic mixed-ligand treatments. *Small* 13, 1700598 (2017).

[34] Bi et al. Colloidal quantum dot tandem solar cells using chemical vapor deposited graphene as an atomically thin intermediate recombination layer. *ACS Energy Lett.* 3, 1753-1759 (2018).

[35] Qian et al. Electroluminescence from light-emitting polymer/ZnO nanoparticle heterojunctions at sub-bandgap voltages. *Nano Today* 5, 384-389 (2010).

[36] Ji et al. The work mechanism and sub-bandgap-voltage electroluminescence in inverted quantum dot light-emitting diodes. *Sci. Reports* 4, 6974 (2014).

[37] Li et al. Single-layer halide perovskite light-emitting diodes with sub-band gap turn-on voltage and high brightness. *J. Phys. Chem. Lett.* 7, 4059-4066 (2016).

[38] Nagpal & Klimov. Role of mid-gap states in charge transport and photoconductivity in semiconductor nanocrystal films. *Nat. Commun.* 2, 486 (2011).

[39] Bae et al. Controlling the influence of Auger recombination on the performance of quantum-dot light-emitting diodes. *Nat. Commun.* 4, 2661 (2013).

[40] Cao et al. The role of surface passivation for efficient and photostable PbS quantum dot solar cells. *Nat. Energy* 1, 16035 (2016).

[41] Zhitomirsky et al. Measuring charge carrier diffusion in coupled colloidal quantum dot solids. *ACS Nano* 7, 5282-5290 (2013).

[42] Ushakova et al. Anomalous size-dependent decay of low-energy luminescence from PbS quantum dots in colloidal solution. ACS Nano 6, 8913-8921 (2012).

[43] Zhou et al. Near Infrared, Highly efficient luminescent solar concentrators. *Adv. Energy Mater.* 6, 1501913 (2016).

[44] Rau. Reciprocity relation between photovoltaic quantum efficiency and electroluminescent emission of solar cells. *Phys. Rev. B* 76, 085303 (2007).

[45] Yao et al. Quantifying losses in open-circuit voltage in solution-processable solar cells. *Phys. Rev. Applied* 4, 014020 (2015).

[46] Tress. Perovskite solar cells on the way to their radiative efficiency limit—insights into a success story of high open-circuit voltage and low recombination. *Adv. Energy Mater.* 7, 1602358 (2017).

[47] Chuang et al. Improved performance and stability in quantum dot solar cells through band alignment engineering. *Nat. Mater.* 13, 796-801 (2014).

[48] Chuang et al. Open-circuit voltage deficit, radiative sub-bandgap states, and prospects in quantum dot solar cells. *Nano Lett.* 15, 3286-3294 (2015).

[49] Walter et al. Determination of defect distributions from admittance measurements and application to Cu(In,Ga)Se2 based heterojunctions. *J. Appl. Phys.* 80, 4411 (1996).

[50] Bozyigit et al. Quantification of deep traps in nanocrystal solids, their electronic properties, and their influence on device behavior. Nano Lett. 13, 5284-5288 (2013).

[51] Lee et al. Inorganic UV-Visible-SWIR broadband photodetector based on monodisperse PbS nanocrystals. *Small* 12, 1328-1333 (2016).

[52] de Mello et al. An improved experimental determination of external photoluminescence quantum efficiency. *Adv. Mater.* 9, 230-232 (1997).

[53] Jin et al. Detecting trap states in planar PbS colloidal quantum dot solar cells. *Sci. Reports,* 6, 37106 (2016).

[54] Griffiths. Introduction to quantum mechanics. Prentice Hall (1995).

[55] Chou & Dennis. Förster resonance energy transfer between quantum dot donors and quantum dot acceptors. Sensors 15, 13288-13325 (2015).

[56] Greenham et al. Angular dependence of the emission from a conjugated polymer light-emitting diode: implications for efficiency calculations. Adv. Mater. 6, 491-494 (1994).

[57] Bhattacharya. Semiconductor optoelectronic devices. Prentice Hall (1997).

[58] Lan et al. Passivation using molecular halides increases quantum dot solar cell performance. Adv. Mater. 28, 299-304 (2016).

What is claimed is:

1. A light emitting device comprising:
a substrate;
a first electrode formed by a first electrically conductive layer arranged over said substrate;
an active light emitting layer arranged over said first electrically conductive layer, and that comprises a host matrix and light emitting quantum dots embedded therewithin, wherein said host matrix comprises charge carrier supplier quantum dots blended with said light emitting quantum dots, forming a binary blend where the charge carrier supplier quantum dots are made and arranged to supply charge carriers to the light emitting quantum dots, and wherein the light emitting quantum dots are made and arranged to accept the supplied charge carriers; and
a second electrode formed by a second electrically conductive layer arranged over said active light emitting layer.

2. The light emitting device of claim 1, wherein said host matrix comprises a ternary blend formed by said binary blend and further quantum dots made and arranged to passivate electronically possible electron traps of the light emitting quantum dots and to balance charge carrier injection.

3. The light emitting device of claim 1, wherein said charge carrier supplier quantum dots are smaller than said light emitting quantum dots, have a larger bandgap and form a type-I heterojunction therewith.

4. The light emitting device of claim 3, wherein said type-I heterojunction has band offsets in the conduction and valence band ranging from 0.05 eV up to 1 eV.

5. The light emitting device of claim 2, wherein said charge carrier supplier quantum dots are smaller than said light emitting quantum dots, have a larger bandgap and form a type-1 heterojunction therewith, wherein said type-1 heterojunction has band offsets in the conduction and valence band ranging from 0.05 eV up to 1 eV, and wherein said further quantum dots have a bandgap that is larger than that of the charge carrier supplier quantum dots, and a band alignment with respect to the bands of the charge carrier supplier quantum dots and light emitting quantum dots that favors injection of electrons or holes in the light emitting quantum dots, but not both.

6. The light emitting device of claim 5, wherein a type-I or quasi type-I heterojunction is formed between the further quantum dots and the light emitting quantum dots, with a band offset for the conduction band ranging from 0 eV to 0.5 eV and a large band offset in the valence band in excess of 1 eV.

7. The light emitting device of claim 1, wherein the concentration of the light emitting quantum dots in the binary blend ranges from 1% up to 20% by volume, and the concentration of the charge carrier supplier quantum dots in the binary blend ranges from 80% up to 99% in volume, preferably from 50% up to 99% by volume.

8. The light emitting device of claim 7, wherein the concentration of the light emitting quantum dots in the binary blend is chosen to reduce the density of states to an extent that decreases the turn-on voltage of the light emitting device below the bandgap of emission.

9. The light emitting device of claim 8, wherein said chosen concentration of the light emitting quantum dots in the binary blend is between 1% and 10%, preferably about or below 7.5%, more preferably below 3% and even more preferably of about 1%.

10. The light emitting device of claim 2, wherein the concentration of the light emitting quantum dots in the ternary blend ranges from 1% up to 20% by volume, and the concentration of the charge carrier supplier quantum dots in the ternary blend ranges from 80% up to 99% in volume, preferably from 50% up to 99% by volume.

11. The light emitting device of claim 10, wherein the concentration of the light emitting quantum dots in the ternary blend is chosen to reduce the density of states to an extent that decreases the turn-on voltage of the light emitting device below the bandgap of emission.

12. The light emitting device of claim 11, wherein said chosen concentration of the light emitting quantum dots in the ternary blend is between 1% and 10%, preferably about or below 7.5%, more preferably below 3% and even more preferably of about 1%.

13. The light emitting device of claim 12, wherein the concentration of the further quantum dots in the ternary blend ranges between 0% and 60% by volume, preferably from 20% up to 50% and more preferably from 30% up to 50%.

14. The light emitting device of claim 1, wherein the host matrix forms an electrically conductive percolating path, while the light emitting quantum dots are dispersed within the host matrix so distanced and isolated from each other that they do not form any electrically conductive path.

15. The light emitting device of claim 1, wherein the charge carrier supplier quantum dots possess carrier diffusion lengths larger than 10 nm for both types of charge carriers, electrons and holes, preferably in a range from 10 nm up to 500 nm.

16. The light emitting device of claim 1, further comprising:
an electron injecting and hole blocking layer arranged between said active light emitting layer and one of said first and second electrodes; and
a hole injecting and electron blocking layer arranged between said active light emitting layer and the other of said first and second electrodes.

17. The light emitting device of claim 16, wherein said electron injecting and hole blocking layer is arranged between the active light emitting layer and the first electrode, and wherein the hole injecting and electron blocking layer is a semiconductor layer that forms a type-II heterojunction with all of the quantum dots of the active light emitting layer.

18. The light emitting device of claim 17, wherein the hole injecting and electron blocking semiconductor layer comprises quantum dots.

19. The light emitting device of claim 1, wherein both the charge carrier supplier quantum dots and the light emitting quantum dots are PbS quantum dots, and/or wherein the further quantum dots are ZnO nanocrystals.

20. The light emitting device of claim 1, wherein the light emitting device is made to emit infrared, near infrared and/or short-wave infrared light.

21. The light emitting device of claim 1, wherein the light emitting quantum dots are isolated from one another by a distance ranging from 5 nm up to 999 nm.

22. The light emitting device of claim 1, wherein the bandgaps of the light emitting quantum dots are from 1.5 eV to 0.5 eV.

23. An optical spectrometer, comprising:
a light emitting device for emitting light with different wavelengths onto an object, wherein the light emitting device comprises:
a substrate;
a first electrode formed by a first electrically conductive layer arranged over said substrate;
an active light emitting layer arranged over said first electrically conductive layer, and that comprises a host matrix and light emitting quantum dots embedded there within, wherein said host matrix comprises charge carrier supplier quantum dots blended with said light emitting quantum dots, forming a binary blend where the charge carrier supplier quantum dots are made and arranged to supply charge carriers to the light emitting quantum dots, and wherein the light emitting quantum dots are made and arranged to accept the supplied charge carriers; and
a second electrode formed by a second electrically conductive layer arranged over said active light emitting layer; and
at least one photodetector made to detect light with any of said different wavelengths.

24. A down-converting film for a light emitting device, where the down-converting film is configured and arranged to be placed atop said light emitting device to absorb and down convert light emitted thereby, and wherein the down-converting film comprises an active light emitting layer that comprises a host matrix and light emitting quantum dots embedded there within, wherein said host matrix comprises charge carrier supplier quantum dots blended with said light emitting quantum dots, forming a binary blend where the charge carrier supplier quantum dots are made and arranged to supply charge carriers to the light emitting quantum dots, and wherein the light emitting quantum dots are made and arranged to accept the supplied charge carriers.

* * * * *